(12) United States Patent
Fujino et al.

(10) Patent No.: US 6,507,532 B1
(45) Date of Patent: Jan. 14, 2003

(54) SEMICONDUCTOR MEMORY DEVICE HAVING ROW-RELATED CIRCUIT OPERATING AT HIGH SPEED

(75) Inventors: Takeshi Fujino; Kazunari Inoue; Akira Yamazaki; Kazutami Arimoto, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/722,687

(22) Filed: Nov. 28, 2000

(30) Foreign Application Priority Data

Nov. 30, 1999 (JP) .............................. 11-339174

(51) Int. Cl.$^7$ ................................. G11C 8/00
(52) U.S. Cl. ................... 365/230.03; 365/233
(58) Field of Search ............................. 365/233, 230.03

(56) References Cited

U.S. PATENT DOCUMENTS

| | | | |
|---|---|---|---|
| 5,708,611 A | * | 1/1998 | Iwamoto et al. ............ 365/195 |
| 5,848,024 A | | 12/1998 | Cho ........................ 365/230.06 |
| 5,926,434 A | * | 7/1999 | Mori ........................... 365/233 |

FOREIGN PATENT DOCUMENTS

| | | |
|---|---|---|
| EP | 0907183 | 4/1999 |
| JP | 9-63269 | 3/1997 |
| JP | 10-74386 | 3/1998 |
| JP | 11-195294 | 7/1999 |

OTHER PUBLICATIONS

European Search Report dated May 18, 2001.

* cited by examiner

Primary Examiner—David Nelms
Assistant Examiner—M. Tran
(74) Attorney, Agent, or Firm—McDermott, Will & Emery

(57) ABSTRACT

A central row-related control circuit transmits an internal row address signal to each memory sub block in banks of memory mats asynchronously with an external clock signal, and latches a block selection signal for specifying a memory sub block synchronously with an internal clock signal for one clock cycle period for transmission to each memory sub block. A spare determination circuit performs spare determination asynchronously with the clock signal. A semiconductor memory device easily adaptable to bank expansion without increase of the chip area and capable of implementing a high speed access can be provided.

29 Claims, 22 Drawing Sheets

2: LOCAL ROW-RELATED CONTROL CIRCUIT

F I G. 5
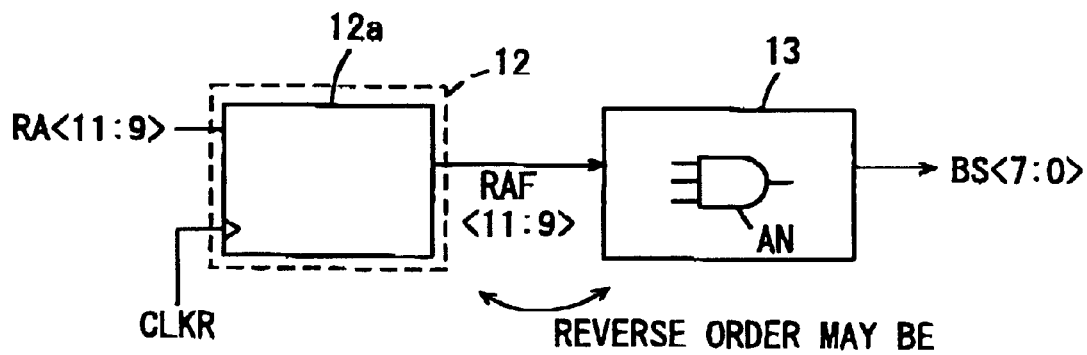
F I G. 6 A
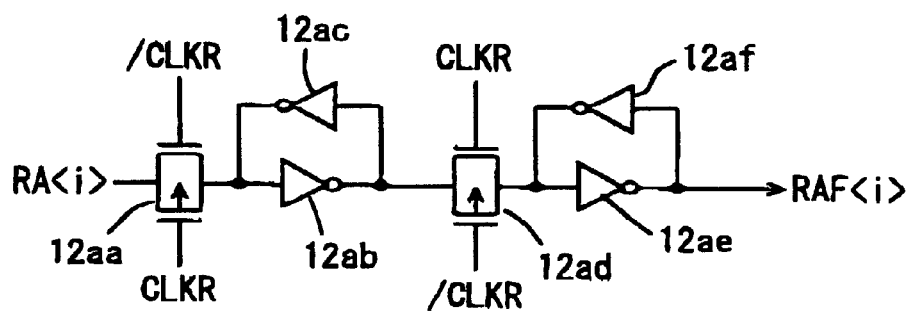
F I G. 6 B
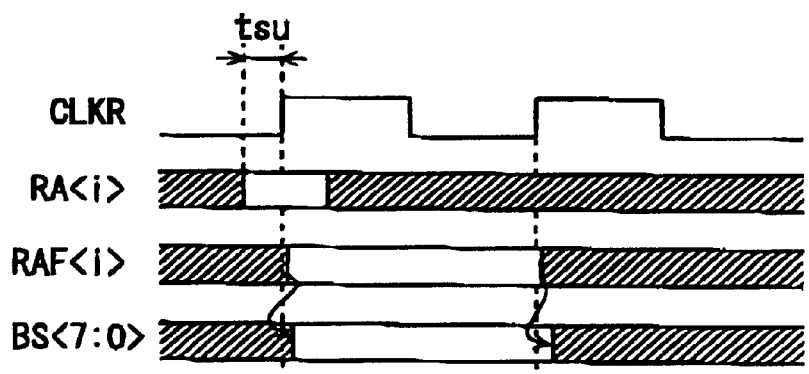

PROVIDED WHEN ADJACENT SUB BLOCK IS IN DIFFERENT BANK

FIG. 20A
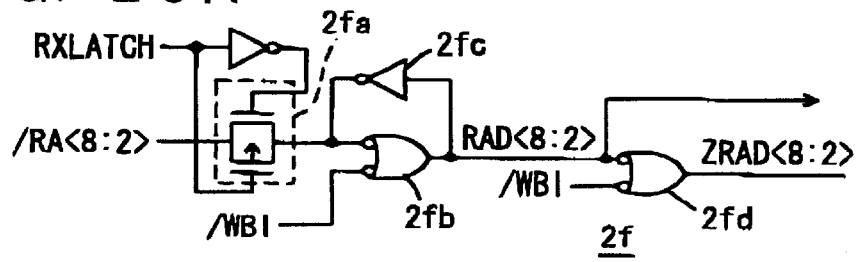
FIG. 20B
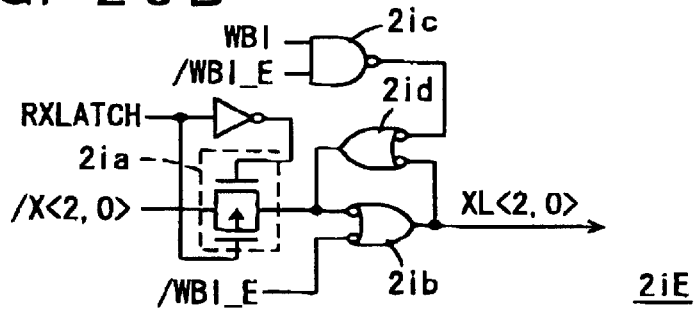
FIG. 20C
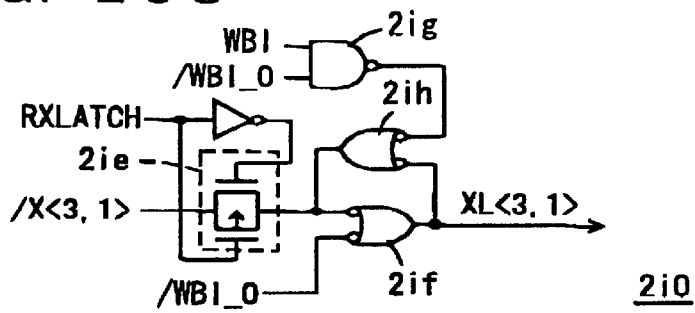
(SEE FIG. 9)
FIG. 21
|  | WBI | WBI_O | WBI_E |
|---|---|---|---|
| RAISE ALL WORD LINES TOGETHER | H | H | H |
| RAISE ODD NUMBER WORD LINES TOGETHER | H | H | L |
| RAISE EVEN NUMBER WORD LINES TOGETHER | H | L | H |
| NORMAL OPERATION | L | L | L |
(*)BURN-IN : RASE → H

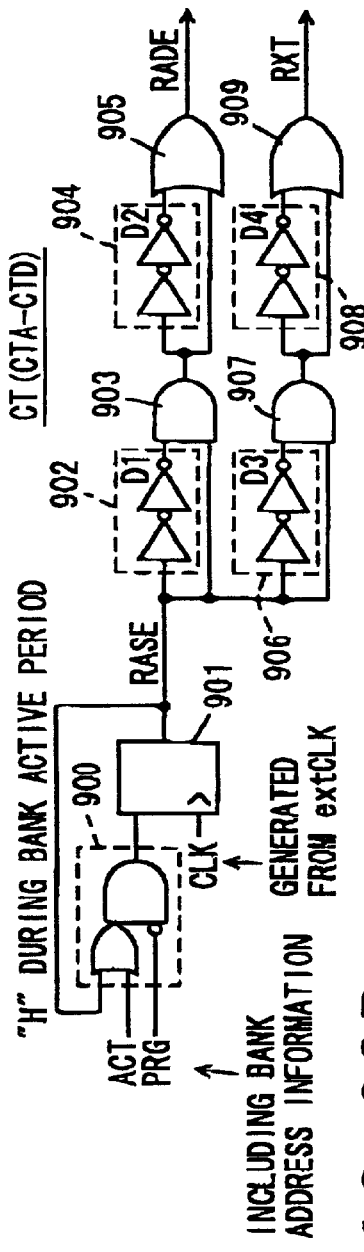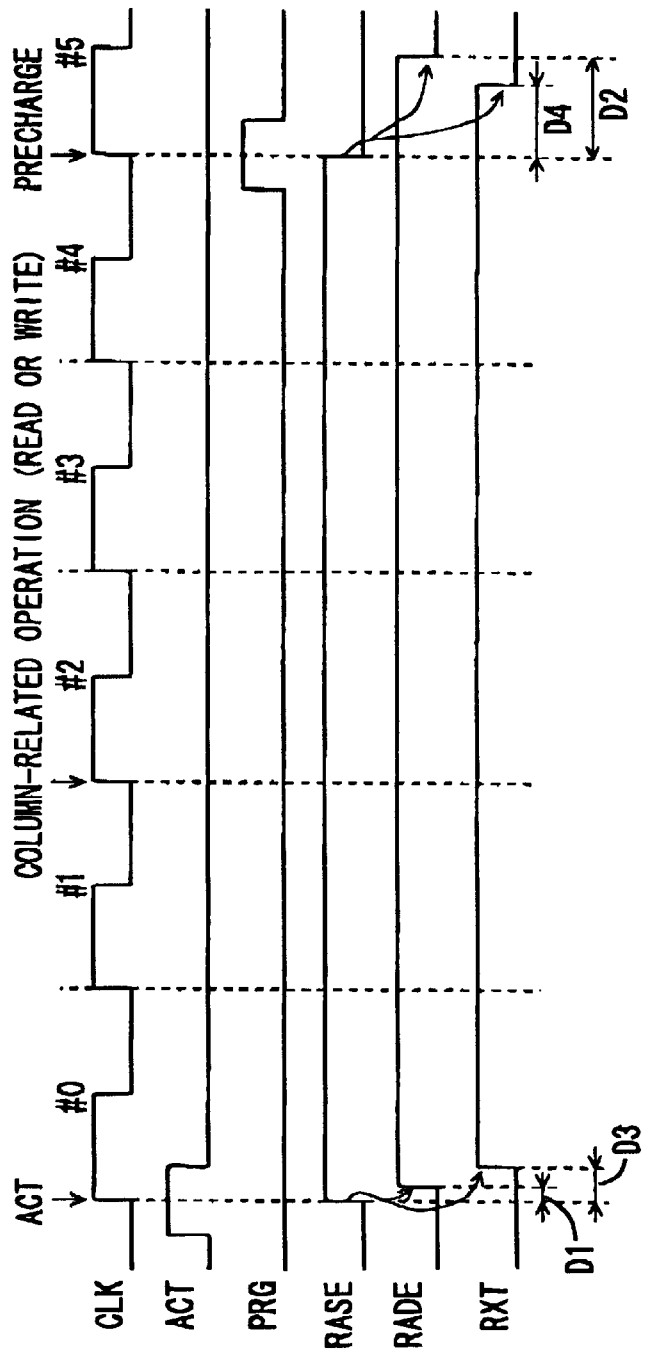
FIG. 26A PRIOR ART
FIG. 26B PRIOR ART

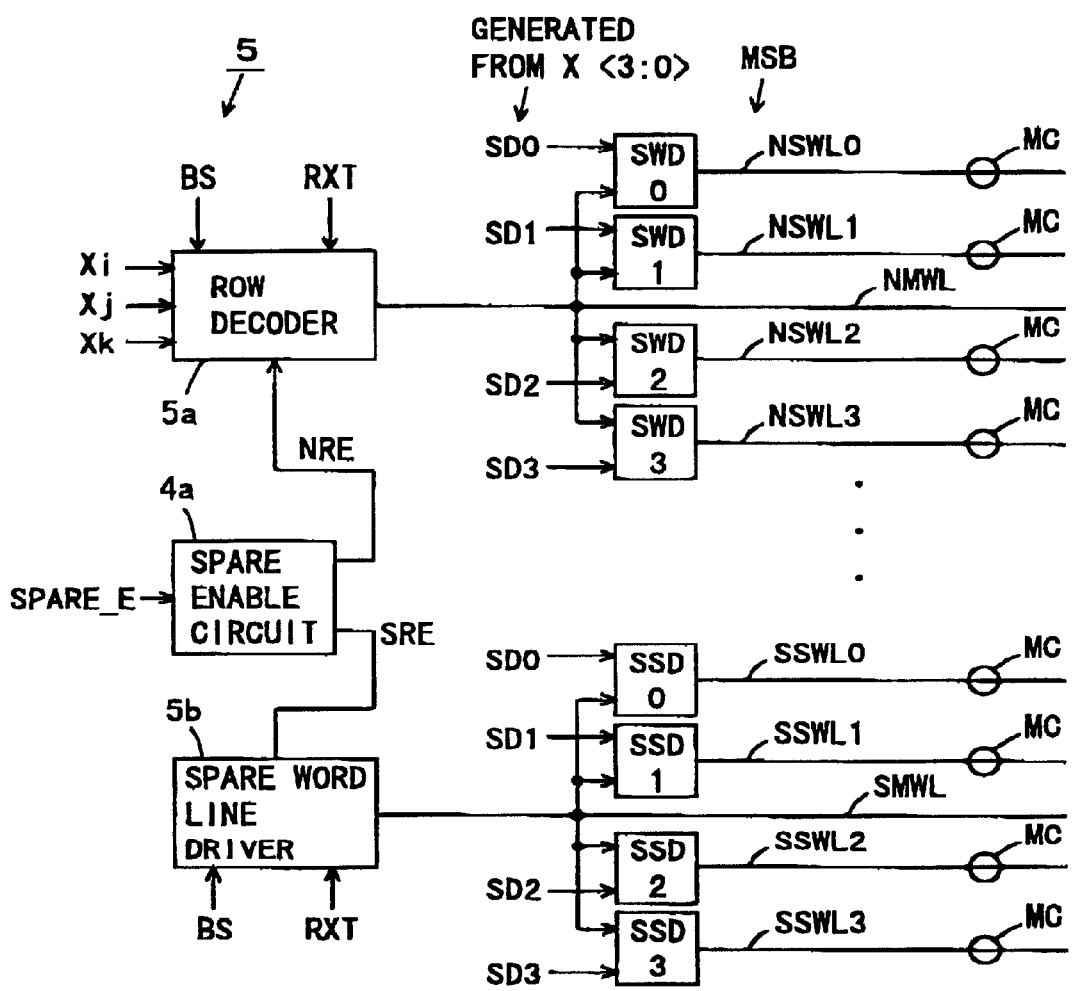
F I G. 3 2 PRIOR ART

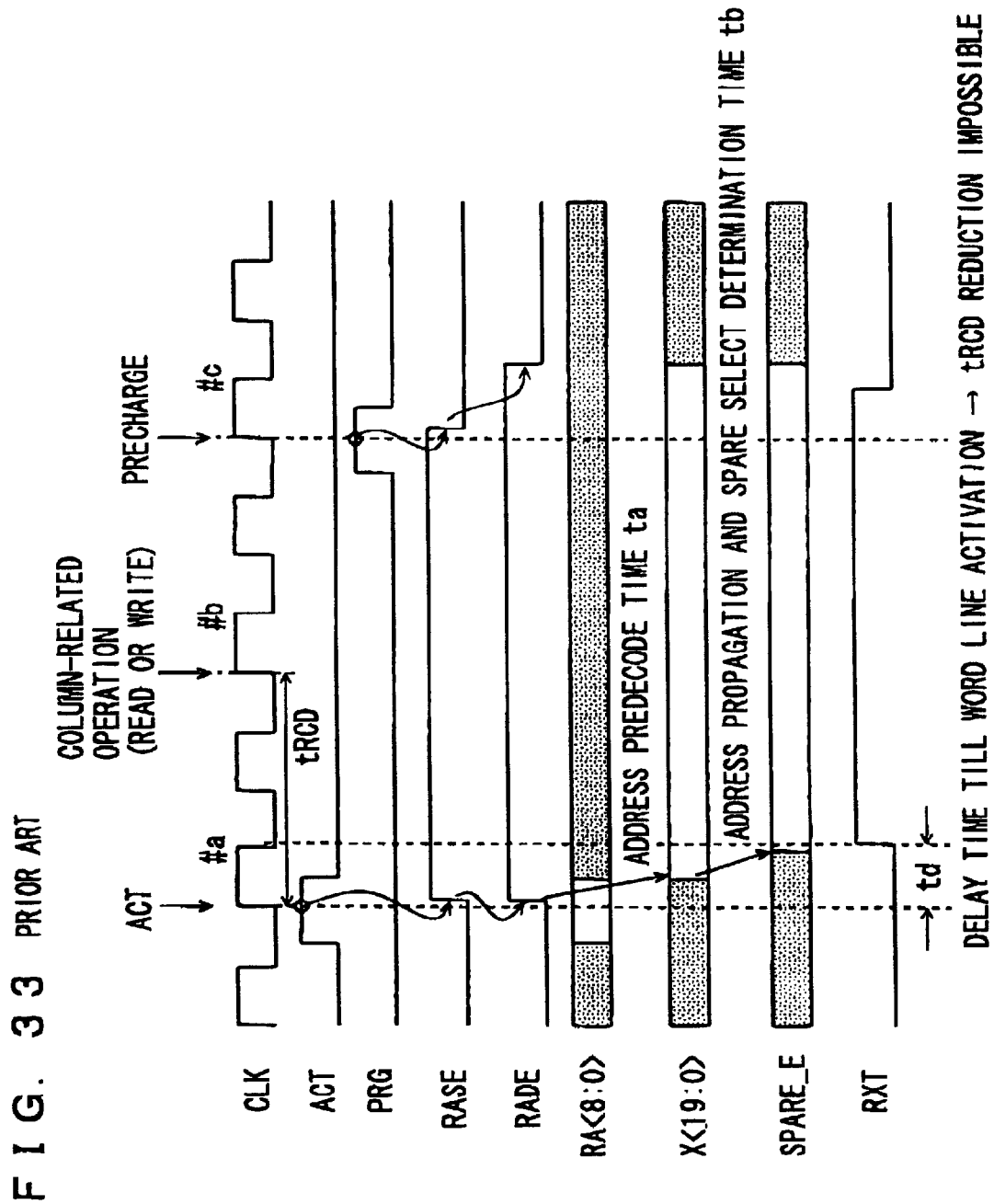

SEMICONDUCTOR MEMORY DEVICE HAVING ROW-RELATED CIRCUIT OPERATING AT HIGH SPEED

BACKGROUND OF THE INVENTION

1. Field of the Invention

The present invention relates to semiconductor memory devices, and particularly to a high speed DRAM (Dynamic Random Access Memory) used for an embedded DRAM and the like. In particular, the invention relates to a row-related control circuit of the high speed DRAM.

2. Description of the Background Art

FIG. 25 is a schematic diagram illustrating an arrangement of row-related circuitry of a conventional DRAM. DRAM shown in FIG. 25 is a clock synchronous DRAM (SDRAM) having a 4-bank structure and storage capacity of 64 Mbits.

Referring to FIG. 25, the DRAM includes four memory mats MMA–MMD allocated respectively to banks A–D. Memory mats MMA–MMD each have the storage capacity of 16 Mbits. Memory mats MMA–MMD are each divided into 16 memory sub blocks MSB each having the storage capacity of 1 M bit. In each of memory mats MMA–MMD, a sense amplifier band SAB including a sense amplifier circuit for sensing, amplifying and latching data in a memory cell of a selected row is arranged between memory sub blocks MSB adjacent to each other.

Row-related control circuits CTA–CTD are respectively associated with memory mats MMA–MMD, and row-related control circuits CTA–CTD each receive externally supplied clock signal extCLK, row address signal RA<11:0>, bank address signal BA<1:0>and a command (not shown) to generate a row-related control signal. Row-related control circuits CTA–CTD generate, when designated by bank address signal BA<1:0>, row predecode signals X_A<19:0>–X_D<19:0> and block selection signals BS_A<7:0>–BS_D<7:0> according to row address signal RA<11:0> applied in synchronization with external clock signal extCLK. 8-bit block selection signal allows two memory sub blocks MSB in a bank (memory mat) designated by bank address signal BA<1:0> to be selected.

When a row-related command (bank activation command; active command) is supplied, row-related control circuits CTA–CTD are selectively activated according to bank address signal BA<1:0> so as to generate row address enable signals RADE_A–RADE_D and word line activation signals RXT_A–RXT_D in synchronization with external clock signal extCLK.

Row-related control circuits CTA–CTD are arranged corresponding to respective memory mats MMA–MMD and these row-related control circuits CTA–CTD are selectively driven according to bank address signal BA<1:0>, so that banks A–D can be driven independently into an active state.

For each memory sub block MSB of memory mats MMA–MMD, there are provided a spare determination circuit (fuse box) 4 for determining whether or not a defective row is addressed, and a row decode circuit 5 for driving memory cells of one row in an associated memory sub block into a selected state according to a corresponding block selection signal among block selection signals BS_A<7:0>–BS_D<7:0> and a corresponding predecode signal among row predecode signals X_A<19:0>–X_D<19:0>. In each of memory mats MMA–MMD, word line selection is performed in each memory sub block MSB and repair of a defective row is done by a redundant row (row spare circuit) in each memory sub block MSB. High-order signal RA<11:9>of the row address is decoded so as to generate block selection signals BS_A<7:0>–BS_D<7:0> when respective row-related control circuits CTA–CTD are activated. Row predecode signals X_A<19:0>–X_D<19:0> are generated from row address signal RA<8:0>.

FIG. 26A illustrates a structure of a row-related control signal generation circuit of the row-related control circuit. FIG. 26A representatively shows one row-related control circuit CT since row-related control circuits CTA–CTD have the same structure.

Referring to FIG. 26A, row-related control circuit CT includes a composite gate circuit 900 receiving active command ACT instructing bank activation and precharge command PRG instructing bank inactivation, a latch circuit 901 for latching an output signal of composite gate circuit 900 in synchronization with rising of internal clock signal CLK, a delay circuit 902 for delaying, by predetermined time D1, bank activation signal RASE received from latch circuit 901, an AND circuit 903 receiving an output signal of delay circuit 902 and bank activation signal RASE, a delay circuit 904 for delaying, by predetermined time D2, an output signal of AND circuit 903, and an OR circuit 905 receiving an output signal of delay circuit 904 and an output signal of AND circuit 903 to generate row address enable signal RADE. Delay circuit 902 and AND circuit 903 constitute a rise delay circuit while delay circuit 904 and OR circuit 905 constitute a fall delay circuit.

Row-related control circuit CT further includes a delay circuit 906 for delaying bank activation signal RASE by predetermined time D3, an AND circuit 907 receiving an output signal of delay circuit 906 and bank activation signal RASE, a delay circuit 908 for delaying an output signal of AND circuit 907 by predetermined time D4, and an OR circuit 909 receiving an output signal of delay circuit 908 and an output signal of AND circuit 907 to generate word line activation signal RXT.

Composite gate circuit 900 is equivalent to a circuit that includes an OR circuit receiving bank activation signal RASE and active command ACT and a gate circuit receiving an output signal of the OR circuit and precharge command PRG. The gate circuit operates as a buffer circuit when precharge command PRG is in an inactive state of L (logic low) level. Internal clock signal CLK generated from external clock signal extCLK is a clock signal synchronized with external clock signal extCLK. Now, an operation of row-related control circuit CT shown in FIG. 26A is described in conjunction with the timing chart shown in FIG. 26B.

In cycle #0 of clock signal CLK, active command ACT is supplied and an output signal of composite gate circuit 900 rises to H (logic high) level. The output signal of composite gate circuit 900 is latched by latch circuit 901 synchronously with rising of internal clock signal CLK, and bank activation signal RASE rises to an active state of H level. After bank activation signal RASE rises to H level, an output signal of AND circuit 903 rises to H level after delay time D1 of delay circuit 902 has passed, and accordingly row address enable signal RADE rises to H level.

In response to rising of bank activation signal RASE, an output signal of AND circuit 907 rises to H level after delay time D3 of delay circuit 906 has passed, and accordingly word line activation signal RXT rises to H level.

Although active command ACT falls to L level, latch circuit 901 is brought into latched state in synchronization with rising of internal clock signal CLK so that bank activation signal RASE is maintained in the active state of H level.

In clock cycle #1, when active command ACT is not supplied (when active command ACT is at L level), bank activation signal RASE is at H level and accordingly an output signal of composite gate 900 is at H level so that latch circuit 901 takes in and latches a signal of H level from composite gate 900. In this way, bank activation signal RASE is maintained in the active state of H level until precharge command PRG is supplied (precharge command PRG attains H level), and accordingly row address enable signal RADE and word line activation signal RXT each are maintained in the active state of H level.

In clock cycles #1–#4, a column-related operation is performed (a read command instructing a data reading or a write command instructing a data writing is supplied).

In clock cycle #5, when precharge command PRG is supplied, an output signal of composite gate 900 falls to L level, latch circuit 901 takes in a signal of L level from composite gate circuit 900 at the rising edge of internal clock signal CLK, and accordingly bank activation signal RASE reaches the inactive state of L level. When bank activation signal RASE falls to L level and accordingly an output signal of AND circuit 903 falls to L level, row address enable signal RADE reaches the inactive state of L level after delay time D2 of delay circuit 902 has passed. Further, after delay time D4 of delay circuit 904, word line activation signal RXT reaches the inactive state of L level. Delay time D2 is longer than delay time D4, so that after word line activation signal RXT and a word line (main/sub word line) in the selected state each reach the inactive state, row address enable signal RADE enters the inactive state and the latched state of the row address signal is released as described later.

FIG. 27 illustrates a structure of an internal address generation circuit included in row-related control circuit CT. A row address signal has a plurality of bits and address generation circuits of the same structure are provided for respective bits. FIG. 27 representatively illustrates one row address generation circuit.

Referring to FIG. 27, the row address generation circuit includes a latch circuit 910 latching row address signal RA synchronously with rising of internal clock signal CLK, an inverter 911 inverting row address enable signal RADE, a transmission gate 912 allowing output signal XA of latch circuit 910 to pass according to an output signal of inverter 911 and row address enable signal RADE, an inverter 913 inverting address signal XA supplied via transmission gate 912, an inverter 914 inverting an output signal of inverter 913 for transmission to an input of inverter 913, an AND circuit 915 receiving address signal XA and row address enable signal RADE supplied via transmission gate 912 to generate internal row address signal RAD, and an AND circuit 916 receiving row address enable signal RADE and an output signal of inverter 913 to generate internal row address signal ZRAD.

Inverters 913 and 914 constitute an inverter latch. Transmission gate 912 enters a nonconductive state when row address enable signal RADE is in the active state of H level. An operation of the row address generation circuit shown in FIG. 27 is described in conjunction with the timing chart shown in FIG. 28.

When active command ACT is supplied, latch circuit 910 latches address signal RA synchronously with rising of internal clock signal CLK and outputs latched row address signal XA. Row address enable signal RADE is in the inactive state of L level and transmission gate 912 is in a conductive state to allow latched row address signal XA from latch circuit 910 to pass.

When row address enable signal RADE is driven into the active state of H level according to the active command, transmission gate 912 enters the nonconductive state, and latched row address signal XA from latch circuit 910 is latched by inverters 913 and 914. Subsequently, even if row address signal XA output from latch circuit 910 varies during the active state of row address enable signal RADE, the internal row address signal is not influenced at all, because transmission gate 912 is nonconductive.

AND circuits 915 and 916 maintain internal row address signals RAD and ZRAD in the inactive state of L level when row address enable signal RADE is at L level. Then, when row address enable signal RADE is driven into the active state, AND circuits 915 and 916 drive row address signals RAD and ZRAD into a corresponding logic state according to the address signal latched by inverters 913 and 914.

Internal row address signals ZRAD and RAD are address signals complementary to each other and their logic levels are held during the period of the active state of H level of row address enable signal RADE. During the active state of H level of row address enable signal RADE, internal row address signals RAD and ZRAD have respective logic levels held. In a similar manner, according to word line activation signal RXT, a word line corresponding to an addressed row can be driven into the selected state so that the selected word line is maintained in the selected state during the period in which the bank is activated.

FIG. 29A is a schematic diagram illustrating a portion for generating a block selection signal included in row-related control circuit CT. Referring to FIG. 29A, the block selection signal generation portion includes a block decode circuit 920 for decoding internal row address signals RAD<11:9> and ZRAD<11:9> to generate block selection signal BS<7:0>. Block decode circuit 920 includes a block decoder provided for each of block selection signals BS<7>–BS<0>. The block decoder is a 3-bit decoder.

FIG. 29B illustrates one example of the block decoder included in block decode circuit 920. Referring to FIG. 29B, a block decoder 920a receives 3-bit internal row address signal bits RAD<11>, RAD<10> and RAD<9> to generate block selection signal BS<7>. 8-bit block selection signal BS<7:0> allows two of sixteen memory sub blocks to be selected. Appropriately combined high-order 3 bits of the row address signal are supplied to block decoder 920a so as to selectively activate block selection signals BS<7>–BS<0>.

FIG. 30 is a schematic diagram illustrating a structure of a row predecode circuit included in row-related control circuit CT. Referring to FIG. 30, row predecode circuit 930 includes a predecode circuit 930a receiving and predecoding internal row address signals RAD<1:0> and ZRAD<1:0> to generate 4-bit predecode signal X<3:0>, a predecode circuit 930b receiving and predecoding internal row address signals RAD<3:2> and ZRAD<3:2> to generate 4-bit predecode signal X<7:4>, a predecode circuit 930c receiving and predecoding internal row address signals RAD<6:4> and ZRAD<6:4> to generate 8-bit predecode signal X<15:8>, and a predecode circuit 930d receiving and predecoding internal row address signals RAD<8:7> and ZRAD<8:7> to generate 4-bit predecode signal X<19:16>.

Each of predecode circuits 930a–930d includes a predecode circuit similar to the decode circuit shown in FIG. 29B as a unit predecode circuit. Predecode signal X<19:0> from row predecode circuit 930 designates memory cells of one row in a memory sub block having memory cells of 512 rows. For example, predecode signal X<19:16> designates a group of memory cells of 128 rows among the memory cells of 512 rows. Predecode signal X<15:8> designates a group of memory cells of 16 rows among a group of memory cells of 128 rows. Predecode signal X<7:4> designates a group of memory cells of 4 rows among a group of memory cells of 16 rows. Predecode signal X<3:0> designates memory cells of one row among a group of memory cells of 4 rows.

Predecode signal X<19:0> is supplied to a corresponding memory mat (bank) together with block selection signal BS<7:0>, and a row decode circuit provided in each memory sub block is activated according to the block selection signal. Then, a row decoding operation is carried out and the memory cells of one row designated by predecode signal X<19:0> in a memory sub block designated by block selection signal BS<7:0> is driven into the selected state.

FIG. 31 is a schematic diagram illustrating spare determination circuit 4 provided for each memory sub block. Referring to FIG. 31, spare determination circuit 4 includes: a precharging P channel MOS transistor PT which is turned on when bank activation signal RASE is inactivated to precharge an output signal line SG to supply voltage Vcc level, fuse elements F4–F19 connected in parallel to output signal line SG; and N channel MOS transistors RT4–RT19 which are connected in series to fuse elements F4–F19 respectively and receive, at respective gates, predecode signals X<4>–X<19>. The sources of MOS transistors RT4–RT19 are connected to the ground node. Spare determination result instruction signal SPARE_E is output from output signal line SG.

One of fuse elements F7–F4 corresponding to predecode signal X<7:4> is blown and one of fuse elements F15–F8 corresponding to predecode signal X<15:8> is cut, and one of fuse elements F19–F16 corresponding to predecode signal X<19:16> is cut so that a defective row address is programmed.

In a normal operation, when bank activation signal RASE is in the inactive state, MOS transistor PT is conductive and output signal line SG is at H level. When bank activation signal RASE attains the active state of H level, MOS transistor PT is turned off and the precharging operation of output signal line SG is completed. Then, predecode signal X<19:4> is supplied. Among fuse elements F4–F19, a fuse element corresponding to a predecode signal that attains H level when a defective row address is designated is blown. When a defective row address is designated by predecode signal X<19:4>, there is no path through which current flows from output signal line SG to the ground node, and spare determination result instruction signal SPARE_E is maintained at H level. On the other hand, if predecode signal X<19:4> is different from the defective row address, at least one of MOS transistors connected in series to a conductive fuse element is turned on, output signal line SG is coupled to the ground node, and accordingly spare determination result instruction signal SPARE_E is driven into L level. Accordingly, determination is made on whether or not a defective row address is designated.

Predecode signal X<3:0> is not used in spare determination circuit 4 for the reason below. In the memory array, the word lines have a hierarchical word line structure including main word lines and sub word lines. Memory cells of one row are connected to a sub word line and one main word line is allocated to a set of a predetermined number of sub word lines. If one main word line is allocated to four sub word lines, one of four sub word lines is designated by predecode signal X<3:0>. In this way, the spare circuit repairs any defect for each main word line so that four sub word lines are replaced simultaneously.

FIG. 32 is a schematic diagram illustrating a structure of a row decode circuit provided for a memory sub block. Referring to FIG. 32, in memory sub block MSB, a normal main word line NMWL, four normal sub word lines NSWL0–NSWL3 corresponding to normal main word line NMWL, and sub word drivers SWD0–SWD3 corresponding to respective normal sub word lines NSWL0–NSWL3 for driving respective sub word lines into the selected state according to sub decode signals SD0–SD3 and a signal on normal main word line NMWL are provided. As a spare circuit, a spare main word line SMWL, four spare sub word lines SSWL0–SSWL3 corresponding to spare main word line SMWL, and spare sub word line drivers SSD0–SSD3 corresponding to respective spare sub word lines SSWL0–SSWL3 for driving respective sub word lines into the selected state according to sub decode signals SD0–SD3 and a signal on spare main word line SMWL are provided. Memory cells in memory sub blocks MSB are connected to sub word lines NSWL0–NSWL3 and SSWL0–SSWL3, respectively.

Spare determination result instruction signal SPARE_E from spare determination circuit 4 is supplied to a spare enable circuit 4a and accordingly normal row enable signal NRE and spare row enable signal SRE are generated. A row decoder 5a associated with normal main word line NMWL is enabled, when normal row enable signal NRE and block selection signal BS are activated, to decode predecode signals Xi, Xj and Xk for driving normal main word line NMWL into the active state according to the result of the decoding and word line activation signal RXT. Predecode signals Xi, Xj and Xk correspond to predecode signals X<7:4>, X<15:8> and X<19:16>, respectively. Sub decode signals SD0–SD3 are generated from predecode signal X<3:0> (in the form of a pair of complementary signals), respectively.

A spare word line driver 5b associated with spare main word line SMWL is enabled, when spare row enable signal SRE from spare enable circuit 4a and block selection signal BS are activated, to drive spare main word line SMWL to the selected state according to word line activation signal RXT. Spare determination circuit 4 is provided for spare main word line SMWL. Therefore, when spare determination result instruction signal SPARE_E of one spare determination circuit attains L level, spare row enable signal SRE is activated and spare main word line SMWL is driven into the selected state. At this time, normal row enable signal NRE is in the inactive state so that row decoder 5a is prevented from decoding and driving main word line NMWL into the selected state.

Only in memory sub block MSB selected by block selection signal BS, a word line (main and sub word lines) is driven into the selected state.

FIG. 33 is a timing chart illustrating a row selecting operation in one bank. In cycle #a of internal clock signal CLK, active command ACT is supplied. In clock cycle #a, bank activation signal RASE is activated according to active command ACT at the rising edge of internal clock signal CLK (see FIG. 26A).

Following the activation of bank activation signal RASE, row address enable signal RADE is activated. In response to the activation of row address enable signal RADE, externally supplied address signal RA is latched as shown in FIG. 27 and internal row address signal RAD<8:0> is defined. Internal row address signals RAD<8:0> and ZRAD<8:0> are predecoded to generate predecode signal X<19:0> and block selection signal BS<7:0>. Block selection signal BS<7:0> and row predecode signal X<19:0> are transmitted from row-related control circuit CT located at the central portion to a corresponding memory mat. In each memory sub block, spare determination and decoding of a predecode signal are carried out.

In the spare determination, spare determination result instruction signal SPARE_E is defined after predecode signal X<19:4> is defined, and normal row enable signal NRE and spare row enable signal SRE are generated according to spare determination result instruction signal SPARE_E (see FIG. 32). After the spare determination result is defined, a row decoder or a spare word line driver is enabled and an associated word line (main word line) is driven into the selected state according to word line activation signal RXT.

Specifically, when a main word line is driven into the selected state after active command ACT is supplied, an addressed main word line is driven into the selected state by a row decoder or a spare word line driver after time ta for address predecode, propagation time of the predecode signal and spare determination time tb are passed, and then a sub word line (normal sub word line or spare sub word line) is driven into the selected state. In other words, the actual time required for driving a word line (sub word line) into the selected state after active command ACT is supplied is time td (ta+tb<td). In clock cycle #a, after active command ACT is supplied, a command (read or write command READ or WRITE) for operating the column-related circuitry is supplied.

Time tRCD required from start of operation of the row-related circuitry to the start of operation of the column-related circuitry is known as RAS-CAS delay time in a standard DRAM. If time (row access time) td from supply of active command ACT to driving of the sub word line to the selected state is long, RAS-CAS delay time tRCD cannot be shortened. Consequently, when internal operation is to be synchronized with high speed internal clock signal CLK, the read command or write command cannot be supplied immediately after active command ACT is supplied. Therefore, even if high speed internal clock signal CLK is employed, a high speed data access cannot be implemented.

Further, as shown in FIG. 31, the spare determination circuit uses predecode signal X<19:4> so that fuse elements F19–F4 should be arranged respectively for bits X<19>–X<4> of the predecode signal, because the predecode signal is transmitted from the row-related control circuit in parallel with a block selection signal. Fuse elements F19–F4 are significantly large in size compared with a normal MOS transistor. The fuse elements occupy the large area since they are cut by a process such as laser blowing. In addition, the spaces between fuse elements F19–F4 are sufficiently large so as to prevent an adverse influence caused by scattering of the fractions of the fuse elements which are generated in the laser blowing. Since there are a large number of fuse elements such as F19–F4, the occupying area of the spare determination circuit is accordingly large and thus the chip area increases.

As shown in FIG. 25, memory mats MMA–MMD are allocated to banks A–D respectively and row-related control circuits CTA–CTD are arranged corresponding to banks A–D respectively. In recent years, at least four banks are required in a high speed memory such as the logic-merged DRAM and Rambus DRAM (RDRAM). When a large number of banks are required, it is difficult to allocate a memory mat to one bank because of a resultant significant increase of the chip area.

Further, in the structure having a row-related control circuit for each bank and predecode signal lines dedicated to that bank, increase of the number of banks increases the area of row-related control circuits and predecode signal line region and thus increases the chip area.

SUMMARY OF THE INVENTION

An object of the present invention is to provide a semiconductor memory device capable of shortening a row access time required for word line activation and easily adaptable to bank expansion.

Another object of the present invention is to provide a semiconductor memory device adaptable to bank expansion without increase of the area and increase of the row access time.

A further object of the invention is to provide a semiconductor memory device having an improved row-related circuit that can overcome those disadvantages of the conventional DRAM.

According to one aspect of the invention, a semiconductor memory device includes a memory array having a plurality of banks, a central control circuit arranged on one side of the memory array and receiving externally supplied clock signal and address signal for generating an internal clock signal and an internal address signal asynchronous with the internal clock signal to transmit the generated signals in common to the banks of the memory array in one direction, a preprocessing circuit provided for each of a plurality of banks of the memory array and latching and predecoding the internal address signal synchronously with a latch timing signal to generate a predecode signal, and a selection circuit provided for each of a plurality of banks of the memory array for selecting an addressed memory cell of the corresponding bank according to the predecode signal from a corresponding preprocessing circuit.

According to a second aspect of the invention, a semiconductor memory device includes a memory array divided into a plurality of banks that are driven into active state independently of each other, each bank divided into a plurality of sub blocks each having a plurality of memory cells. A plurality of banks each include a predetermined number of sub blocks.

According to the second aspect of the invention, the semiconductor memory device further includes a control signal generation circuit shared by a plurality of banks for supplying, to each bank, a control signal for driving a designated bank into active state according to a bank activation instruction signal, a block selection signal generation circuit shared by a plurality of banks for latching a block selection signal supplied in parallel with the bank activation instruction signal synchronously with an externally supplied clock signal and supplying the block selection signal commonly to a plurality of banks, an address generation circuit supplying an address signal externally supplied asynchronously with the clock signal commonly to a plurality of banks, and a preprocessing circuit provided for each of a plurality of banks for latching the address signal from the address generation circuit according to a latch timing signal and decoding the latched address signal when an operation control signal included in the control signal is activated. The operation control signal is set in the active state during the period in which a corresponding bank is set in the active state by the bank activation instruction signal.

According to the second aspect of the invention, the semiconductor memory device further includes a spare determination circuit provided for each of a plurality of banks, for determining whether or not the address signal from the address generation circuit designates a defective bit address based on the address signal and a programmed defective bit address to output a spare determination result instruction signal indicating the result of the determination, a spare latch circuit latching an output signal of the spare determination circuit according to a latch timing signal, and a spare enable circuit generating a spare enable signal for activating a spare circuit for repairing a defective bit according to an output signal of the spare latch circuit.

An address signal is commonly applied from the central control circuit to a plurality of banks asynchronously with an internal clock signal, and then predecoded in each bank synchronously with a latch timing signal. Accordingly, the address signal can be transmitted to each bank utilizing the address set up time and thus the time required for propagation of the address signal can be shortened. In addition, the address signal is transmitted commonly to a plurality of banks in one direction. Even if the number of banks included in the memory array increases, there is no increase in the number of transmitted address signals and bits so that the semiconductor memory device is easily adaptable to bank expansion.

The spare determination operation is done utilizing the address signal and the spare determination result signal is latched according to the latch timing signal so as to perform a subsequent predecode operation. In this way, the spare determination can be done utilizing the address set up time so as to decrease the time required for address propagation and spare determination. Consequently, the row access time can be reduced. Since the address signal is commonly transmitted to a plurality of banks, the semiconductor memory device is easily adaptable to bank expansion.

The control signal is transmitted to each respective bank. Therefore, even if the address signal is commonly transmitted to a plurality of banks, a designated operation is correctly performed only in a designated bank.

As heretofore described, a semiconductor memory device capable of accomplishing high speed access without increase of the chip area even if bank expansion is done can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a schematic diagram illustrating structures of a block latch circuit and block decode circuit shown in FIG. 2.

FIG. 6A illustrates an ample of a structure of the block latch circuit in FIG. 5 and FIG. 6B is a timing chart illustrating an operation of the block latch circuit shown in FIG. 6A.

FIGS. 20A–20C show a structure of a level latch circuit included in a preprocessing circuit in a third embodiment of the invention.

FIG. 21 is a list of relations between control signals and selected word lines in a wafer burn-in mode.

FIG. 26A shows a structure of a bank control circuit shown in FIG. 25 and

FIG. 26B is a timing chart illustrating an operation of a bank control circuit shown in FIG. 26A.

FIG. 32 is a schematic diagram showing a word line driving portion of the conventional semiconductor memory device.

FIG. 33 is a timing chart illustrating an operation of the conventional semiconductor memory device.

DESCRIPTION OF THE PREFERRED EMBODIMENTS

First Embodiment

Figure 1:
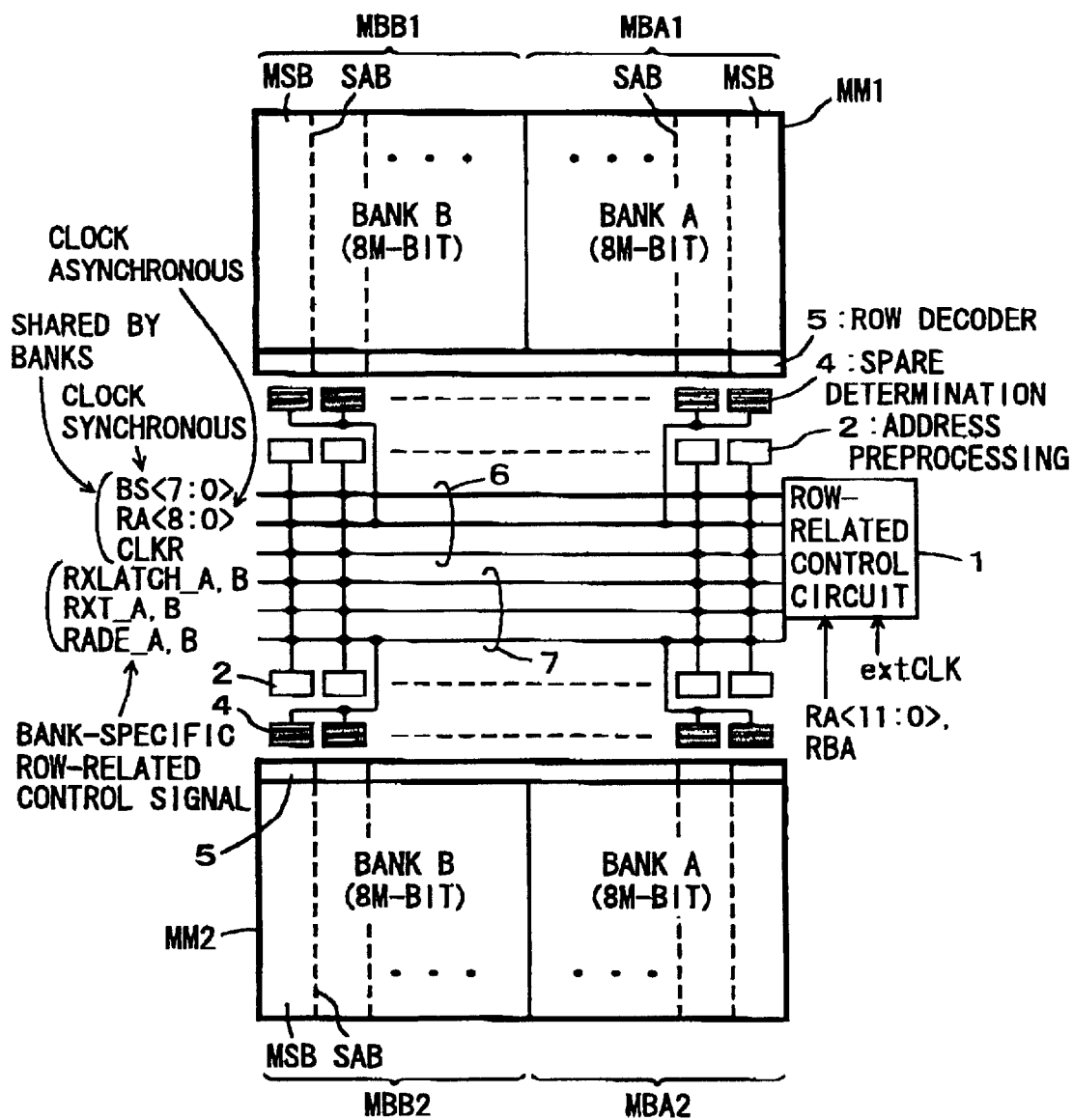
FIG. 1 is a schematic diagram illustrating an entire structure of a semiconductor memory device according to a first embodiment of the invention.

FIG. 1 is a schematic diagram showing a structure of a main portion of a semiconductor memory device according to the first embodiment of the invention. Referring to FIG. 1, the semiconductor memory device includes two memory mats MM1 and MM2 arranged facing to each other. Memory mat MM1 is divided into two memory blocks MBA1 and MBB1 respectively allocated to bank A and bank B, and memory mat MM2 is divided into two memory blocks MBA2 and MBB2 respectively allocated to bank A and bank B. Each of memory blocks MBA1, MBA2, MBB1 and MBB2 has a storage capacity of 8 Mbits and is divided into memory sub blocks MSBs each having a storage capacity of 1 M bit. Memory blocks MBA1, MBA2, MBB1 and MBB2 each include eight memory sub blocks MSBs. A sense amplifier band SAB is arranged between memory sub blocks MSBs adjacent to each other for sensing, amplifying and latching data in memory cells of a selected row.

On one side of memory mats MM1 and MM2, a (central) row-related control circuit 1 is provided which receives externally supplied row bank address signal RBA, row address signal RA<11:0>, external clock signal extCLK and a command (not shown) to generate a row-related operation control signal. Row-related control circuit 1 transmits internal clock signal CLKR synchronized with external clock signal extCLK, row address signal RA<8:0> that is asynchronous with clock signal CLKR (extCLK) and generated according to external address signal RA<11:0>, and block selection signal BS<7:0> that is generated by decoding 4-bit row address signal RA<11:9> and synchronized with clock signal CLKR (extCLK) via a bank-common signal bus 6 in one direction. Block selection signal BS<7:0> specifies one of eight memory sub blocks MSBs. Row address signal RA<8:0> specifies memory cells of one row in one memory sub block. Internal clock signal CLKR, row address signal RA<8:0> and block selection signal BS<7:0> transmitted on bank-common signal bus 6 are signals common to bank A and bank B.

When an active command is supplied, row-related control circuit 1 generates row-related control signals RXLATCH_A, B, RXT_A, B and RADE_A, B for each bank according to simultaneously supplied row bank address RBA for transmission in one direction via a bank-specific signal bus 7.

An (address) preprocessing circuit 2, a spare determination circuit 4, and a row decoder 5 are arranged corresponding to each memory sub block MSB included in memory mats MM1 and MM2. (Address) preprocessing circuit 2 receives row address signal RA<8:0>, latches and predecodes it according to row-related control signals RXLATCH (RXLATCH_A or B) and RADE (RADE_A or B) for supply to a corresponding row decoder 5. Spare determination circuit 4 makes spare determination on row address signal RA<8:0> asynchronously with the clock signal and supplies a spare determination result instruction signal to a corresponding row decoder 5. The spare determination is performed asynchronously with clock signal CLKR (extCLK) utilizing address set up time. Consequently, the result of spare determination can be defined speedily and the operation of selecting internal word lines can be started earlier.

Spare determination circuit 4 receives 9-bit row address RA<8:0> for performing the spare determination. If fuse programming is used to program a defective bit address, just 9-bit fuse elements are required. Compared with a structure of making the spare determination using 20-bit predecode signal X<19:0>, the number of fuse elements is significantly reduced and accordingly the area occupied by spare determination circuit 4 can be reduced.

Block selection signal BS<7:0> and row address signal RA<8:0> are common to bank A and bank B. Even if the number of banks increases in memory mats MM1 and MM2 for bank expansion, the number of bits of signals transmitted on bank-common signal bus 6 does not increase at all so that the semiconductor memory device is adaptable to the bank expansion without increase of the area occupied by interconnection lines. Although the number of bank-specific signal buses 7 transmitting bank-specific row-related control signals for respective banks increases, the number of row-related control signals is smaller than that of address signals and accordingly increase of the area occupied by interconnection lines could be made minimum.

Figure 2:
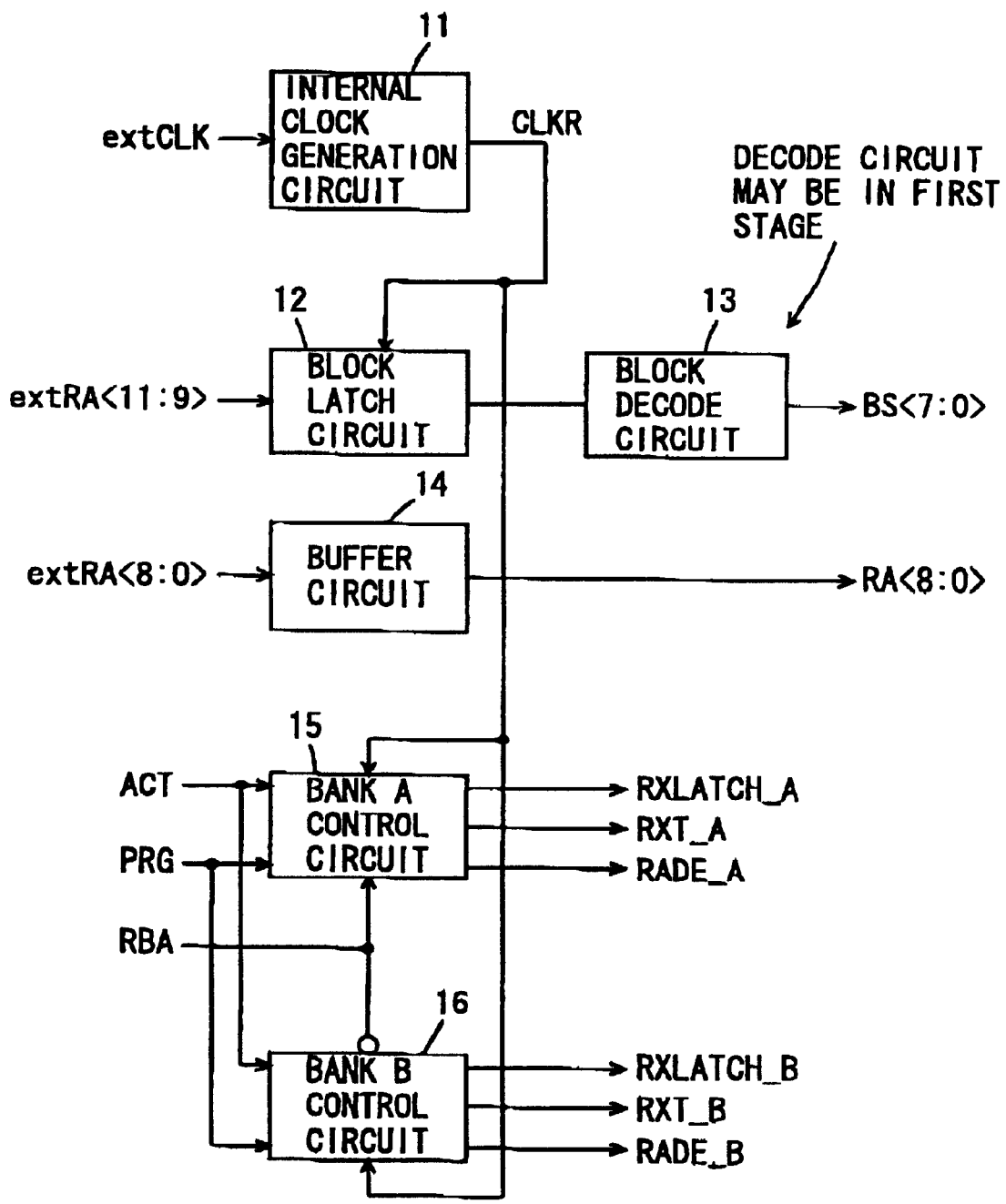
FIG. 2 is a schematic diagram illustrating a structure of a central row-related control circuit shown in FIG. 1.

FIG. 2 is a schematic diagram showing a structure of (central) row-related control circuit 1 shown in FIG. 1. Referring to FIG. 2, (central) row-related control 1 includes an internal clock generation circuit 11 receiving external clock signal extCLK to generate internal clock signal CLKR synchronized with external clock signal extCLK, a block latch circuit 12 taking in externally supplied address bits extRA<11:9> synchronously with internal clock signal CLKR for holding for one clock cycle period, a block decode circuit 13 decoding an output address bit of block latch circuit 12 to generate block selection signals BS<7:0>, and a buffer circuit 14 buffering externally supplied address bits extRA<8:0> to generate internal address bits RA<8:0>. Buffer circuit 14 has a function of buffering externally supplied row address bits extRA<8:0> and operates asynchronously with internal clock signal CLKR. Buffer circuit 14 may be constituted of a repeater. Internal clock generation circuit 11 is constituted of a buffer circuit, a PLL (Phase Locked Loop) or a DLL (Delayed Locked Loop).

Row-related control circuit 1 further includes a bank A control circuit 15 and a bank B control circuit 16 each receiving active command ACT, precharge command PRG and row bank address signal RBA to generate an internal row-related control signal according to a supplied command when designated by row bank address signal RBA. Bank A control circuit 15 is activated, when active command ACT is supplied and row bank address signal RBA designates bank A, to generate row-related control signals RXLATCH_A, RXT_A and RADE_A that are activated in a predetermined sequence. Bank B control circuit 16 is enabled when row bank address signal RBA designates bank B, and activates row-related control signals RXLATCH_B, RXT_A and RADE_B in a predetermined sequence when active command ACT is supplied. Bank A control circuit 15 and bank B control circuit 16 take in a command synchronously with internal clock signal CLKR, and maintain corresponding row-related control signals RXLATCH, RXT and RADE in the active state during the period in which a corresponding bank is in the active state.

Block selection signals BS<7:0> are latched for one clock cycle period of internal clock signal CLKR. Thus, a selected block can be driven surely into the selected state while a non-selected sub block can be maintained in the non-selected state in a local row control circuit (preprocessing circuit). Further, row address bits RA<8:0> are supplied commonly to banks A and B asynchronously with internal clock signal CLKR via buffer circuit 14. If the set up time of the row address signal is utilized, spare determination can be made in a memory sub block of each bank receiving row address bits RA<8:0>.

Control signals supplied individually to each of banks A and B are latch instruction signal RXLATCH_A, B, word line activation signal RXT_A, B, and row address enable signal RADE_A, B. In addition to these signals, a sense amplifier activation signal, a bit line isolation instruction signal and a bit line equalize signal may be transmitted thereto. However, the number of these control signals is significantly smaller than the number of address bits. Therefore, even if these row-related control signals are transmitted individually to each of bank A and bank B, the area occupied by signal lines can be reduced enormously relative to the structure in which predecode signals are individually transmitted to each respective bank.

Figure 3:
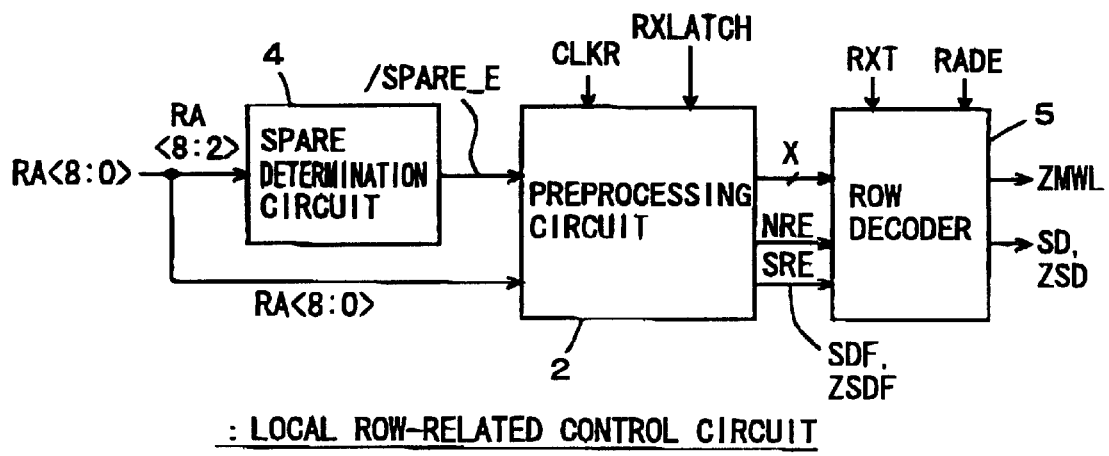
FIG. 3 is a schematic diagram illustrating a structure of a preprocessing circuit shown in FIG. 1.

FIG. 3 is a schematic diagram showing a structure of a local row-related control circuit for each memory sub block. Referring to FIG. 3, the local row-related control circuit includes: spare determination circuit 4 that includes a fuse programming circuit storing a defective bit address and receives row address bits RA<8:2> from buffer circuit 14 shown in FIG. 2 to determine whether or not row address bit RA<8:2> designates the defective bit address; preprocessing circuit 2 that takes in row address bit RA<8:0> and a spare determination result instruction signal from spare determination circuit 4 in synchronization with internal clock signal CLKR, latches them synchronously with latch instruction signal RXLATCH and predecodes the latched row address bits, and row decoder 5 that receives row predecode signal X (X<19:0>) from preprocessing circuit 2 and is responsive to word line activation signal RXT and row address enable signal RADE for generating main word line drive signal ZMWL. Row decoder 5 further generates sub decode signals SD and ZSD complementary to each other.

As shown in FIG. 3, in the local row-related control circuit, spare determination circuit 4 executes the spare determination before row address bits RA<8:0> are taken in synchronously with internal clock signal CLKR in preprocessing circuit 2. Therefore, when preprocessing circuit 2 receives row address bits RA<8:0>, the spare determination result has been defined so that the operation timing of row decoder 5, particularly the timing of activating word line activation signal RXT can be made faster. In this way, the time required from supply of active command ACT to driving of main word line MWL and sub word line SWL into the selected state (row access time) can be reduced. Further, spare determination circuit 4 just receives 7-bit row address RA<8:2> and the occupied area thereby can be reduced.

In preprocessing circuit 2, the predecode operation is performed to generate predecode signal X to be supplied to adjacent row decoder 5. Therefore, consideration of propagation time of address signal RA is unnecessary and word lines (main word line and sub word line) can be driven into the selected state at a faster timing.

Figure 4:
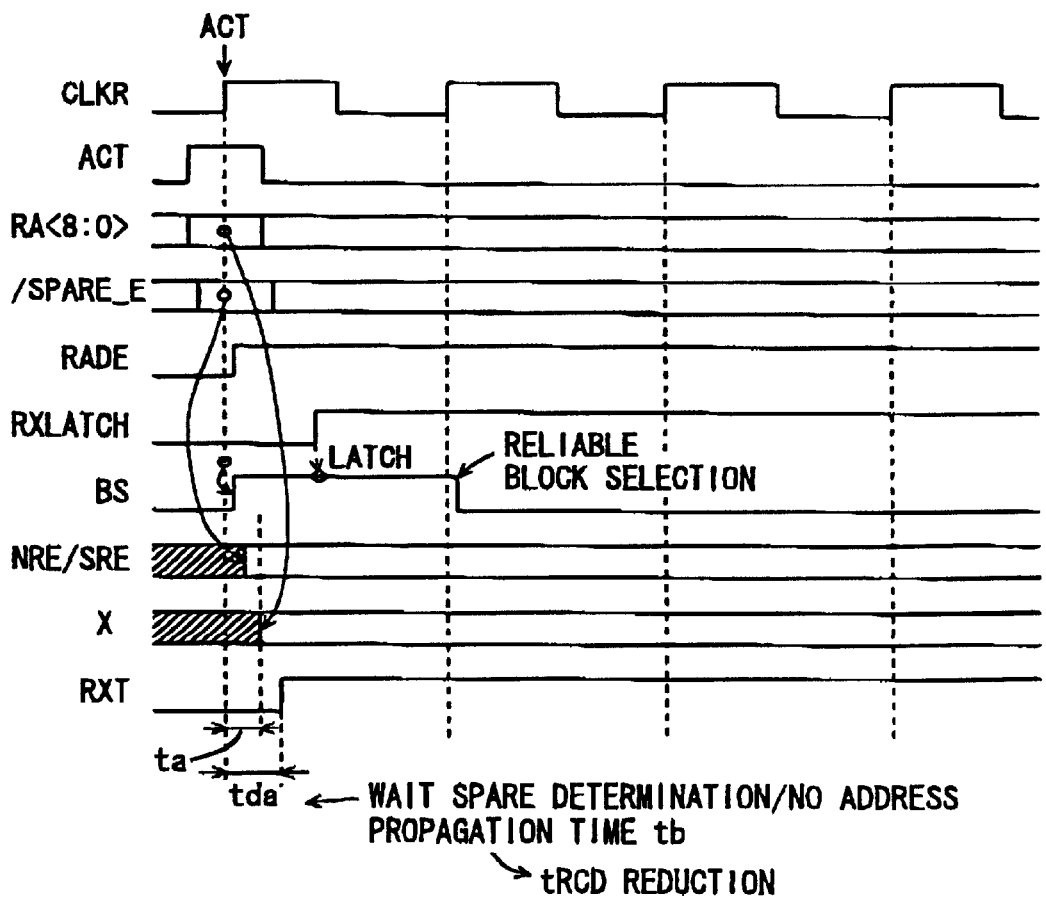
FIG. 4 is a timing chart illustrating an operation of the semiconductor memory device in the first embodiment of the invention.

FIG. 4 is a timing chart illustrating an operation of the semiconductor memory device in the first embodiment of the invention. An operation of row-related circuits shown in FIGS. 1 to 3 is now described in conjunction with FIG. 4.

Row address bits RA<8:0> are externally supplied in parallel with active command ACT, and active command ACT is taken into central row-related control circuit 1 according to clock signal CLKR and responsively a row-related operation control signal is generated. Row address bits RA<8:0> are transmitted to the local row-related control circuit provided in each memory sub block via buffer circuit 14. Before the rising of internal clock signal CLKR, the spare determination is performed according to row address bits RA<8:2> in spare determination circuit 4 shown in FIG. 3 and spare determination result instruction signal /SPARE_E from spare determination circuit 4 attains the definite state.

Then, clock signal CLKR rises to H level and accordingly bank A control circuit 15 or bank B control circuit 16 shown in FIG. 2 operates to drive row-related control signals RADE, RXLATCH and RXT into the active state in a predetermined sequence. Further, block selection signal BS (one of BS<7:0>) is driven into the selected state in synchronization with the rising of clock signal CLKR and maintained in the selected state for one clock cycle period.

In preprocessing circuit 2, in synchronization with the rising of internal clock signal CLKR, spare determination result instruction signal /SPARE_E is taken in and normal row enable signal NRE or spare row enable signal SRE is driven into the active state and latched according to latch instruction signal RXLATCH.

Then, a predecode circuit included in preprocessing circuit 2 predecodes the supplied row address bits RA<8:0>, generates predecode signal X and supplies it to row decoder 5. Predecode signal X from preprocessing circuit 2 is transmitted to row decoder 5 located in the vicinity thereof through a short distance. Therefore, the time required for predecode signal X to attain the definite state is time ta from rising of internal clock signal CLKR to H level. With a consideration of a propagation time required for predecode signal X from preprocessing circuit 2 to be transmitted to row decoder 5, word line activation signal RXT can be driven into the selected state at the timing a little later relative to time ta. Specifically, consideration of the spare determination and address propagation time tb (see FIG. 33) is unnecessary, so that the word line activation signal can be driven into the active state when time tda has passed from the rising of internal clock signal CLKR. Delay time tda is shorter than the conventional delay time td shown in FIG. 33 by time tb and accordingly so-called RAS-CAS delay time tRCD can be shortened. As a result, row access time (the time required for an addressed memory cell row to be driven into the selected state after supply of an active command) can be reduced.

The structure of each section is hereinafter described in detail.

Structure of Block Selection Signal Generating Portion

FIG. 5 is a schematic diagram showing structures of block latch circuit 12 and block decode circuit 13 shown in FIG. 2. Referring to FIG. 5, block latch circuit 12 includes an up edge trigger type latch circuit 12a 2a taking in row address bits RA<11:9> supplied at the rising edge of internal clock signal CLKR to output address bits RAF<11:9>. Up edge trigger type latch circuit 12a is set into the latched state at the rising of internal clock signal CLKR and maintained in the latched state until internal clock signal CLKR rises next.

Block decode circuit 13 includes a 3-input AND type decode circuit AN. 3-bit address signal RAF<11:9> causes one of 8-bit block selection signal BS<7:0> to be selected. Output bits RAF<11:9> of up edge trigger type latch circuit 12a are in the definite state for one clock cycle period and accordingly the block selection signal is maintained in the definite state for one clock cycle period.

FIG. 6A shows a structure corresponding to one bit of up edge trigger type latch circuit 12*a* shown in FIG. 5. Referring to FIG. 6A, the one bit latch circuit includes a CMOS transmission gate 12*aa* made conductive selectively according to complementary internal clock signals CLKR and /CLKR, an inverter 12*ab* inverting an address bit supplied through CMOS transmission gate 12*aa*, an inverter 12*ac* inverting an output signal of inverter 12*ab* for transmission to an input of inverter 12*ab*, a transmission gate 12*ad* made conductive complementarily to CMOS transmission gate 12*aa* according to complementary internal clock signals CLKR and /CLKR to allow an output signal of inverter 12*ab* to pass, an inverter 12*ae* inverting the address bit passed through CMOS transmission gate 12*ad* to generate row address bit RAF<i>, and an inverter 12*af* inverting output signal bit RAF<i> from inverter 12*ae* for transmission to an input of inverter 12*ae*. Complementary clock signal /CLKR is generated by inverting internal clock signal CLKR by an inverter. Inverters 12*ab* and 12*ac* constitute an inverter latch, while inverters 12*ae* and 12*af* constitute an inverter latch.

CMOS transmission gate 12*aa* becomes conductive when internal clock signal CLKR is at L level, and CMOS transmission gate 12*ad* becomes conductive when internal clock signal CLKR is at H level. An operation of this one bit latch circuit shown in FIG. 6A is now described in conjunction with the timing chart shown in FIG. 6B.

At the time preceding the rising edge of internal clock signal CLKR by set up time tsu, row address bit RA<i> attains the valid state. When internal clock signal CLKR is at L level, CMOS transmission gate 12*aa* is conductive and row address bit RA<i> in the valid state is transmitted via CMOS transmission gate 12*aa* to be latched by inverters 12*ab* and 12*ac*.

CMOS transmission gate 12*ad* is in the OFF state at this time and row address bit RAF<i> is in the invalid state.

When internal clock signal CLKR attains H level, CMOS transmission gate 12*aa* is set into the OFF state, row address bit RA<i> which has been supplied is latched by inverters 12*ab* and 12*ac* and isolated from an external address signal. Further, CMOS transmission gate 12*ad* attains the ON state, the row address bit latched by inverters 12*ab* and 12*ac* is transmitted through CMOS transmission gate 12*ad*, and row address bit RAF<i> becomes valid to be latched by inverters 12*ae* and 12*af*.

In the period in which internal clock signal CLKR is at H level, CMOS transmission gate 12*ad* is in the ON state while CMOS transmission gate 12*aa* is in the OFF state. Internal row address bit RAF<i> maintains the bit value latched by inverter latches 12*ab* and 12*ac*. When internal clock signal CLKR falls to L level again, CMOS transmission gate 12*aa* and CMOS transmission gate 12*ad* respectively attain ON and OFF states and inverters 12*ab* and 12*ac* each latch a new address bit. The newly obtained row address bit is usually invalid row address bit. CMOS transmission gate 12*ad* is in the OFF state and row address bit RAF<i> maintains the valid state.

When internal clock signal CLKR attains H level again, CMOS transmission gate 12*ad* reaches the ON state. Row address bit RAF<i> changes to the invalid state according to the address bit in the invalid state latched by inverters 12*ab* and 12*ac*.

In this way, row address bit RAF<i> is taken in at the rising edge of internal clock signal CLKR and maintains the valid state for one clock cycle period.

Block decode circuit 13 decodes 3-bit row address RAF<11:9>. One block selection signal among 8-bit block selection signals BS<7:0> is driven into the selected state. As shown in FIG. 6B, in the period in which row address bit RAF<i> is in the valid state, a corresponding block selection signal maintains the valid state.

Block selection signals BS<7:0> are maintained in the valid state for one clock cycle period. Consequently, when a block selection signal is latched in a bank activation period according to latch instruction signal RXLATCH, the timing margin between the latch instruction signal RXLATCH and the block selection signal can be secured sufficiently as described below.

Structure of Spare Determination Circuit

Figure 7:
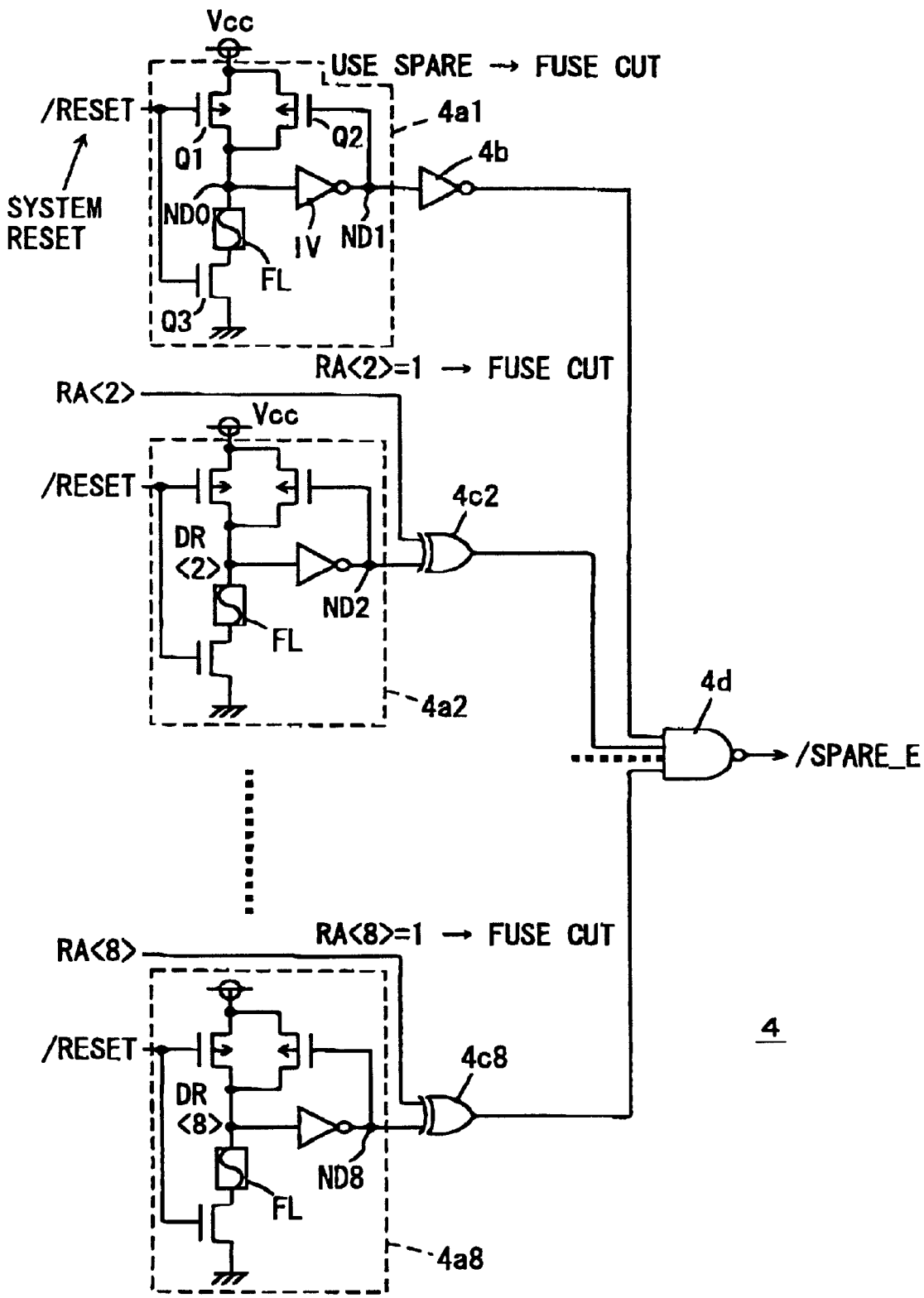
FIG. 7 illustrates a structure of a spare determination circuit shown in FIG. 1.

FIG. 7 shows one example of a structure of spare determination circuit 4. Referring to FIG. 7, spare determination circuit 4 includes a fuse program circuit 4*a*1 for indicating whether or not a spare circuit is used, fuse program circuits 4*a*2–4*a*8 provided for respective row address bits RA<2>–RA<8>, an inverter 4*b* inverting an output signal of fuse program circuit 4*a*1, EXOR circuits 4*c*2–4*c*8 for detecting mismatch between output signals of respective fuse program circuit 4*a*2–4*a*8 and row address bits RA<2>–RA<8>, and an NAND circuit 4*d* receiving an output signal of inverter 4*b* and output signals of respective EXOR circuits 4*c*2–4*c*8 to generate spare determination result instruction signal /SPARE_E.

Fuse program circuits 4*a*1–4*a*8 have the same structure and components of only the fuse program circuit 4*a*1 have the reference characters in FIG. 7. Fuse program circuit 4*a*1 includes a P channel MOS transistor Q1 responsive to reset signal /RESET activated when the system is reset or the power is turned on, for becoming conductive to charge node ND0 to supply voltage Vcc level, a fuse element FL connected to node ND0, an N channel MOS transistor Q3 connected between fuse element FL and the ground node and receiving, at its gate, reset signal /RESET, an inverter IV inverting a signal on node ND0, and a P channel MOS transistor Q2 made conductive, when an output signal of inverter IV is at L level, to charge node ND0 to supply voltage Vcc level. An operation of spare determination circuit 4 is next described briefly.

Row address bits RA<2>–RA<8> are used to address one main word line.

If there is no defective memory cell row, fuse element FL in fuse program circuit 4*a*1 is maintained in the conductive state. If there is a defective memory cell row, fuse element FL in fuse program circuit 4*a*1 is cut. When reset signal /RESET attains the active state of L level, MOS transistor Q1 is turned on and node ND0 is precharged to supply voltage Vcc level (MOS transistor Q3 is in the nonconductive state). When the reset operation is completed, MOS transistor Q1 is turned off and MOS transistor Q3 is turned on. If fuse element FL is cut, inverter IV and MOS transistor Q2 allow node ND0 to stay at supply voltage Vcc level. If fuse element FL is not blown off, node ND0 is discharged to the ground voltage level, an output signal of inverter IV attains H level and MOS transistor Q2 is turned off. If there is no defective memory cell row and accordingly the spare circuit (spare main/sub word line) is not used, fuse element FL is not blown off, node ND0 is at the ground voltage level and an output signal of inverter 4*b* is at L level. Accordingly, spare determination result instruction signal /SPARE_E from NAND circuit 4*d* is fixed at H level and the spare circuit is not used.

If the spare circuit is used, fuse element FL is cut, node ND0 attains supply voltage Vcc level and accordingly an output signal of inverter 4*b* attains H level. NAND circuit 4*d* operates as an inverter buffer, and spare determination result instruction signal /SPARE_E from NAND circuit 4d reaches H or L level according to whether or not row address bits RA<2>–RA<8> designate a defective row address.

In spare program circuits 4a2–4a8, when corresponding defective row address bits RA<2>–RA<8> are "1" (H level), corresponding fuse elements FLs are cut. In fuse program circuits 4a2–4a8, fuse element FL is selectively cut according to the row address of a defective bit to program the defective bit address.

EXOR circuits 4c2–4c8 each operate as a non-coincidence detection circuit. Specifically, if there is a defective bit address, fuse element FL is cut and accordingly corresponding output node NDi (i=2–8) reaches L level. In other words, fuse elements FL cause the voltage level of the nodes connecting to fuse elements FL to be set at a logic level corresponding to the defective bit address. An inverted address of the programmed defective bit address appears on nodes ND2–ND8. Therefore, if all of the supplied row address bits RA<2>–RA<8> are opposite in logic levels to respective signals on nodes ND2–ND8, this means that the defective address programmed by fuse elements FL coincides with row address bits RA<2>–RA<8>. In this case, EXOR circuits 4c2–4c8 all output signals at H level and accordingly spare determination result instruction signal /SPARE_E from NAND circuit 4d is at L level. The determination shows that a defective bit address is addressed and a defective bit must be repaired. If row address bits RA<2>–RA<8> are different from the defective bit address, any of EXOR circuits 4c–2c8 outputs a signal at L level indicating non-coincidence and accordingly spare determination result instruction signal /SPARE_E outputted from NAND circuit 4d attains H level. In this way, spare determination can be made.

There are various modifications of the spare determination circuit shown in FIG. 7. For example, fuse element FL may be blown off when a corresponding defective address bit is "0" (L level). In this case, EXNOR circuits are employed instead of EXOR circuits 4c–2c8. Output nodes ND2–ND8 of fuse program circuits 4a2–4a8 have logic levels according to defective bit address bits DR<2>–DR<8> and the EXNOR circuits determine whether there is coincidence with address bits RA<2>–RA<8>.

As shown in FIG. 7, seven fuse elements for row address bits RA<8:2> are employed and one fuse element is used for indicating whether a spare circuit is used or not. Therefore, eight fuse elements FLs in total are just utilized so that the number of fuse elements can be significantly reduced compared with the case in which predecode signal X<19:0> is used. As the gate circuits such as EXOR circuits 4c–2c8 and NAND circuit 4d are used, the number of gate circuits increases. However, the fuse elements are large enough in size compared with the gate circuits because laser trimming is performed. In addition, fuse elements should be spaced apart sufficiently in order to prevent adverse influences (e.g. short circuit) on a fuse element neighboring to a laser-blown fuse element. The number of fuse elements FLs can be reduced by half, for example, to reduce the area occupied by the spare determination circuit relative to the conventional device even if the number of gate circuits increases.

Structure of Bank Control Circuit

Figure 8A:
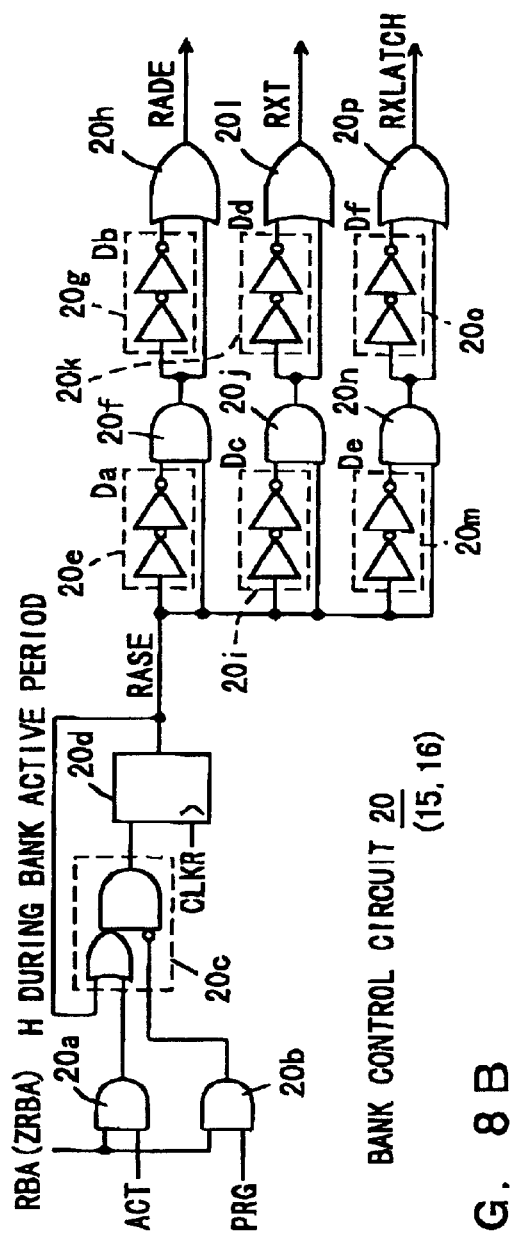
FIG. 8A illustrates structures of a bank A control circuit and a bank B control circuit shown in FIG. 2.

FIG. 8A shows a structure of bank A control circuit 15 and bank B control circuit 16 included in the central row-related control circuit. Bank A control circuit 15 and bank B control circuit 16 have the same structure and the only difference is the logic level of the row bank address signal supplied thereto. Therefore, FIG. 8A representatively shows a bank control circuit 20 instead of bank A control circuit 15 and bank B control circuit 16.

Referring to FIG. 8A, bank control circuit 20 includes an AND circuit 20a receiving active command ACT and row bank address signal RBA (or ZRBA), an AND circuit 20b receiving precharge command PRG and row bank address signal RBA (or ZRBA), a composite gate circuit 20c receiving output signals of AND circuits 20a and 20b and bank activation signal RASE, and an up edge trigger type latch circuit 20d taking in an output signal of composite gate 20c at the rising edge of internal clock signal CLKR.

Composite gate 20c equivalently includes an OR circuit receiving an output signal of AND circuit 20a and bank activation signal RASE, and a gate circuit receiving an output signal of the OR circuit and an output signal of AND circuit 20b. The gate circuit outputs a signal of L level when the output signal of AND circuit 20b is at H level and operates as a buffer circuit when the output signal of AND circuit 20b is at L level. Up edge trigger type latch circuit 20d having a structure similar to that shown in FIG. 6 takes in an output signal of composite gate circuit 20c at the rising edge of internal clock signal CLKR and latches the signal for one clock cycle period.

Bank control circuit 20 further includes a delay circuit 20e having delay time Da, an AND circuit 20f receiving bank activation signal RASE and an output signal of delay circuit 20e, a delay circuit 20g delaying an output signal of AND circuit 20f by delay time Db, and an OR circuit 20h receiving an output signal of AND circuit 20f and an output signal of delay circuit 20g to generate row address enable signal RADE. AND circuit 20f and delay circuit 20e constitute a rise delay circuit while delay circuit 20g and OR circuit 20h constitute a fall delay circuit.

Figure 8B:
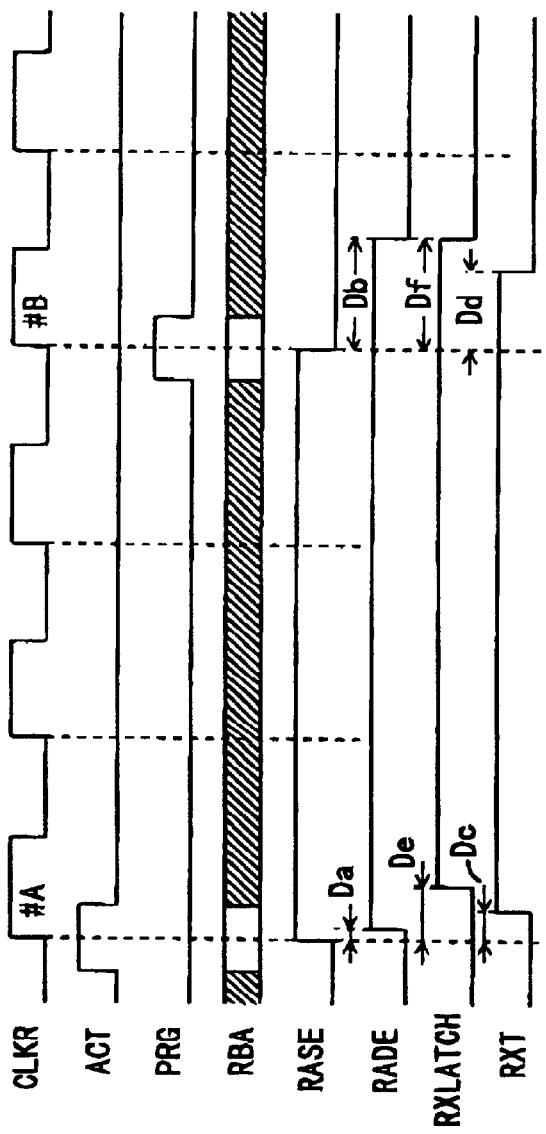
FIG. 8B is a timing chart illustrating an operation of the bank control circuits shown in FIG. 8A.

Bank control circuit 20 further includes a delay circuit 20i delaying bank activation signal RASE by delay time Dc, an AND circuit 20j receiving an output signal of delay circuit 20i and bank activation signal RASE, a delay circuit 20k delaying an output signal of AND circuit 20j by delay time Dd, an OR circuit 20l receiving output signals of AND circuit 20j and delay circuit 20k to generate word line activation signal RXT, a delay circuit 20m delaying bank activation signal RASE by delay time De, an AND circuit 20n receiving bank activation signal RASE and an output signal of delay circuit 20m, a delay circuit 20o delaying an output signal of AND circuit 20n by delay time Df, and an OR circuit 20p receiving output signals of delay circuit 20o and AND circuit 20n to generate latch instruction signal RXLATCH. Delay circuit 20i and AND circuit 20j constitute a rise delay circuit while delay circuit 20k and OR circuit 20l constitute a fall delay circuit. Further, delay circuit 20m and AND circuit 20n constitute a rise delay circuit while delay circuit 20o and OR circuit 20p constitute a fall delay circuit. Therefore, row-related operation control signals RADE, RXT and RXLATCH correspond to signals having their rising and falling edges delayed relative to bank activation signal RASE. An operation of bank control circuit 20 shown in FIG. 8A is now described in conjunction with the timing chart shown in FIG. 8B.

In clock cycle #A, active command ACT is supplied and simultaneously row bank address signal RBA is supplied. In clock cycle #A, when internal clock signal CLKR rises to H level, up edge trigger type latch circuit 20d takes in an output signal of composite gate 20c and latches it. In synchronization with the rising of internal clock signal CLKR, bank activation signal RASE rises to H level, and after delay time Da passed, row address enable signal RADE is driven into the active state. Then, latch instruction signal RXLATCH rises to H level after delay time De of delay circuit 20m passed. Then, word line activation signal RXT is driven into the active state of H level after delay time Dc of delay circuit 20i passed.

In clock cycle #A, even if active command ACT is driven into the inactive state of L level, latch circuit 20d is latched and bank activation signal RASE is driven into the active state at least in one clock cycle period. In the next clock cycle, even if internal clock signal CLKR rises to H level again, an output signal of composite gate 20c stays at H level, bank activation signal RASE stays in the active state of H level until precharge command PRG is supplied next, and accordingly row address enable signal RADE, word line activation signal RXT and latch instruction signal RXLATCH also stay at the active state of H level. According to these signals RADE, RXLATCH and RXT, predecoding of a row address and selection of a main word line and a sub word line are carried out.

In clock cycle #B, when precharge command PRG is supplied, an output signal of AND circuit 20b reaches H level and an output signal of composite gate 20c reaches L level. Therefore, in this clock cycle #B, when internal clock signal CLKR attains H level, bank activation signal RASE falls to L level and accordingly row address enable signal RADE enters the inactive state of L level after delay time Db passed. Further, after delay time Df, latch instruction signal RXLATCH is driven into the inactive state of L level. After delay time Dd, word line activation signal RXT is driven into the inactive state of L level. These successive operations cause the bank in the active state to be driven into the inactive state. Row address enable signal RADE, word line activation signal RXTB and latch instruction signal RXLATCH which are row-related operation control signals are generated individually and independently for bank A and bank B so that bank A and bank B can be driven into the active/inactive state independently of each other.

Structure of Preprocessing Circuit

Figure 9:
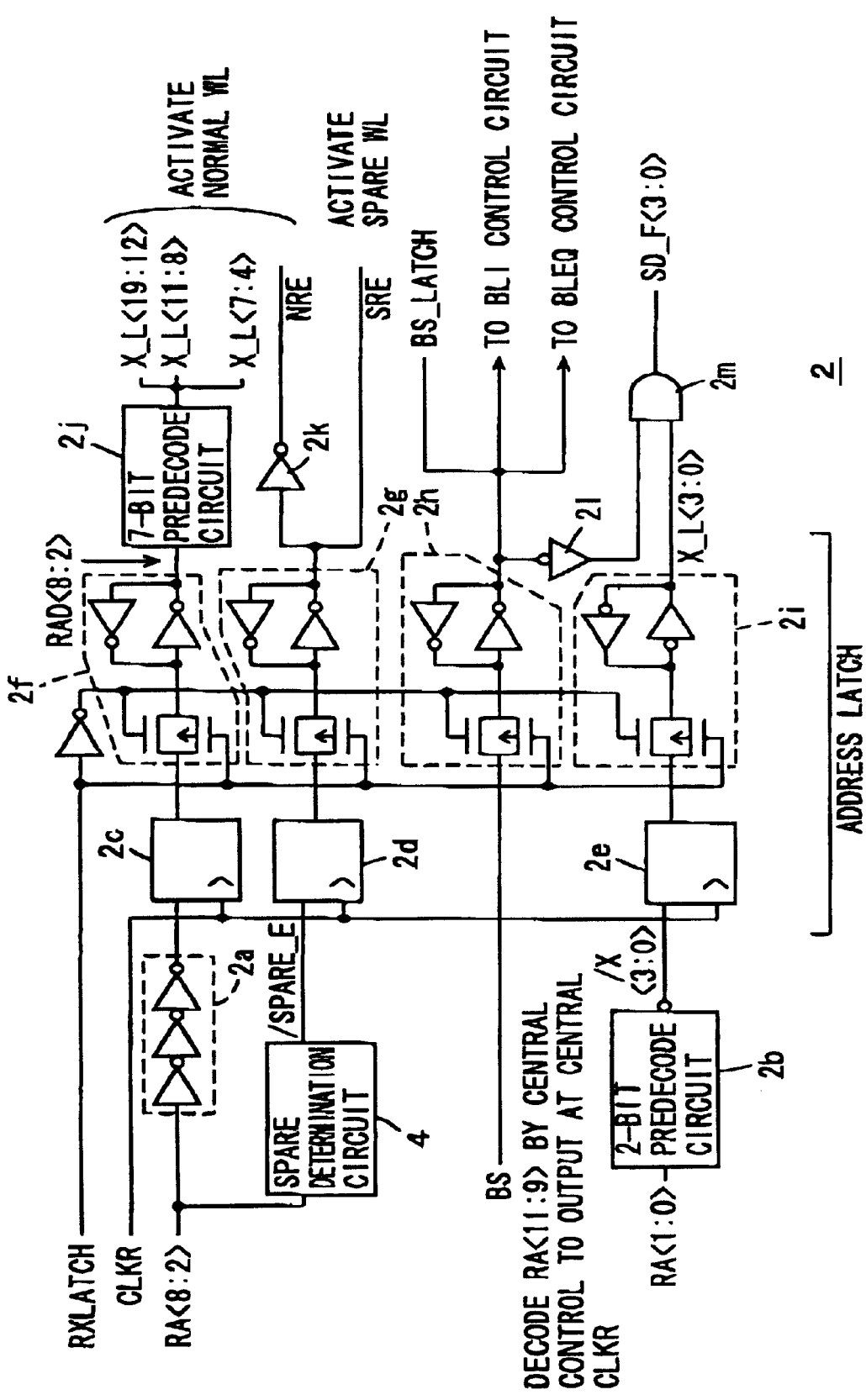
FIG. 9 illustrates a structure of the preprocessing circuit shown in FIG. 1.

FIG. 9 is a schematic diagram showing a structure of preprocessing circuit 2 provided corresponding to each memory sub block. Referring to FIG. 9, preprocessing circuit 2 includes a delay/invert circuit 2a for delaying and inverting row address bits RA<8:2>, a 2-bit predecode circuit 2b for predecoding 2-bit row address RA<1:0> asynchronously with internal clock signal CLKR to generate predecode signals /X<3:0>, an up edge trigger type latch circuit 2c for taking in and latching an output signal of delay/invert circuit 2a synchronously with the rising of internal clock signal CLKR, an up edge trigger type latch circuit 2d for taking in and latching spare determination result instruction signal /SPARE_E from spare determination circuit 4 synchronously with the rising of internal clock signal CLKR, an up edge trigger type latch circuit 2e for taking in and latching predecode signals /X<3:0> outputted from 2-bit predecode circuit 2b synchronously with the rising of internal clock signal CLKR, a level latch circuit 2f latching an output signal of latch circuit 2c synchronously with latch instruction signal RXLATCH, a level latch circuit 2g latching an output signal of latch circuit 2d synchronously with latch instruction signal RXLATCH, a level latch circuit 2h latching block selection signal BS synchronously with the rising of latch instruction signal RXLATCH, and a level latch circuit 2i latching an output signal of latch circuit 2e synchronously with the rising of latch instruction signal RXLATCH. Each of level latch circuits 2f–2i includes a CMOS transmission gate made conductive according to latch complementary instruction signals RXLATCH and /RXLATCH (output signal of inverter), and an inverter latch latching a signal transmitted through this CMOS transmission gate.

Since the spare determination by spare determination circuit 4 requires a certain time, delay circuit 2a is provided to allow signals supplied to latch circuits 2c and 2d to have an almost equal set up time relative to internal clock signal CLKR. The reason why 2-bit predecode circuit 2b is provided is discussed below. Predecode signals /X<3:0> from 2-bit predecode circuit 2b are used for driving a sub word line. If 2-bit row address RA<1:0> is latched by the level latch circuit and then predecoded, activation of a main word line and activation of the sub decode signal occur simultaneously and accordingly the activation timing of the sub word line driver is delayed. In order to allow the sub word line driver to drive an addressed sub word line into the selected state according to a sub decode signal immediately after activation of a main word line, 2-bit predecode circuit 2b is configured to predecode the signal within the row address set up time.

Up edge trigger type latch circuits 2c–2e are each constituted of a flip-flop or latch circuit holding a supplied signal for one clock cycle period, as the structure shown in FIG. 6.

The latching operation of level latch circuits 2f–2i is controlled by using latch instruction signal RXLATCH. Accordingly, the block selection signal, row address bits RAD<8:2> and predecode signals X_L<3:0> can surely be maintained in the active state in a selected bank in the period in which the bank is in the active state.

Preprocessing circuit 2 further includes a 7-bit predecode circuit 2j predecoding output bits RAD<8:2> from level latch circuit 2f to generate predecode signals X_L<19:12>, X_L<11:8> and X_L<7:4>, an inverter 2k inverting an output signal of level latch circuit 2g to generate normal row enable signal NRE, an inverter 2l inverting latch block selection signal BS_LATCH output from level latch circuit 2h, and an AND circuit 2m receiving an output signal of inverter 2l and predecode signals X_L<3:0> output from level latch circuit 2i to generate sub decode signals SD_F<3:0> to a selected block. AND circuit 2m includes an AND gate provided to each of predecode signal bits X_L<3:0>.

Latch block selection signal BS_LATCH from level latch circuit 2h is also supplied to a BLI control circuit for controlling a bit line isolation gate included in a sense amplifier band associated with a memory subblock and to a BLEQ control circuit for controlling a bit line equalize circuit. An output signal of level latch circuit 2g is supplied to a spare word line driver as spare row enable signal SRE described later.

As clearly shown in FIG. 9, prior to the rising of internal clock signal CLKR, spare determination circuit 4 makes spare determination utilizing set up time of row address bits RA<8:2>. At the rising of internal clock signal CLKR, spare determination result instruction signal /SPARE_E is taken in to be output by latch circuit 2d. Latch instruction signal RXLATCH does not include a block selection signal and is activated only for a selected bank. Therefore, in a preprocessing circuit provided to each memory sub block in a selected bank, a supplied signal is taken in according to internal clock signal CLKR and the latch operation is carried out according to latch instruction signal RXLATCH. 7-bit predecode circuit 2j does not respond to a block selection signal. 7-bit predecode circuit 2j in each memory sub block of a selected bank performs predecoding to generate predecode signals X_L<19:4>. Alternatively, latch block selection signal BS_LATCH may be supplied to 7-bit predecode circuit 2j and predecoding of 7-bit row address RAD<8:2> may be performed in only a selected block.

AND circuit 2m drives sub decode fast signals SD_F<3:0> according to block selection signal BS and according to latch predecode signals X_L<3:0> only for a selected memory sub block.

As clearly shown in FIG. 9, when up edge trigger type latch circuit 2d takes in spare determination result instruction signal /SPARE_E synchronously with the rising of internal clock signal CLKR, level latch circuit 2g is conductive (latch instruction signal RXLATCH is at L level) and accordingly normal row enable signal NRE and spare row enable signal SRE are driven into the definite state according to an output signal of spare determination circuit 4 synchronously with clock signal CLKR. When latch instruction signal RXLATCH is driven into the active state, level latch circuit 2g enters a latching state (CMOS transmission gate is in OFF state) and normal row enable signal NRE and spare row enable signal SRE for this memory sub block are maintained in the definite state during the period in which a corresponding bank is in the active state. In this way, at the rising of internal clock signal CLKR, normal row enable signal NRE and spare row enable signal SRE are defined so that normal row decoder and spare row decoder can be driven at a faster timing to drive an addressed word line or a spare circuit into the selected state.

Structure of 2-Bit Predecode Circuit

Figure 10:
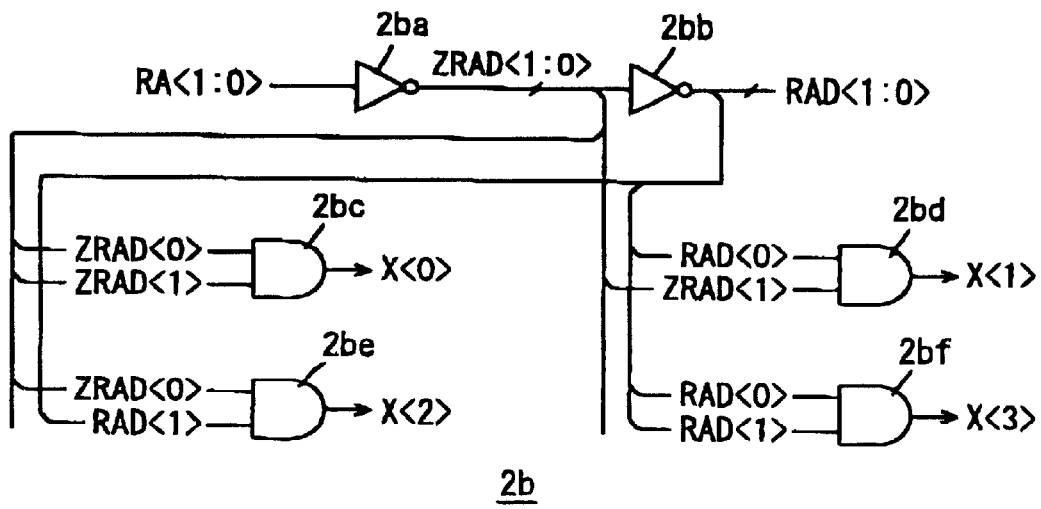
FIG. 10 illustrates a structure of a 2-bit predecode circuit shown in FIG. 9.

FIG. 10 is a schematic diagram showing a structure of 2-bit predecode circuit 2b shown in FIG. 9. Referring to FIG. 10, 2-bit predecode circuit 2b includes an inverter circuit 2ba inverting row address bits RA<1:0>, an inverter circuit 2bb inverting output bits ZRAD<1:0> of inverter circuit 2ba, an AND circuit 2bc receiving bits ZRAD<0> and ZRAD<1> included in output signals of inverter circuits 2ba and 2bb to generate predecode signal X<0>, an AND circuit 2bd receiving bits RAD<0> and ZRAD<1 > included in output signals of inverter circuits 2baand 2bb to generate predecode signal X<1>, an AND circuit 2be receiving bits ZRAD<0> and RAD<1> included in output signals of inverter circuits 2ba and 2bb to generate predecode signal X<2>, and an AND circuit 2bf receiving bits RAD<0> and RAD<1 > included in output signals of inverter circuits 2ba and 2bb to generate predecode signal X<3>. 4-bit predecode signals X<0>–X<3> are generated from 2-bit row address RA<1:0> to specify one of four sub word lines provided to one main word line.

Figure 11:
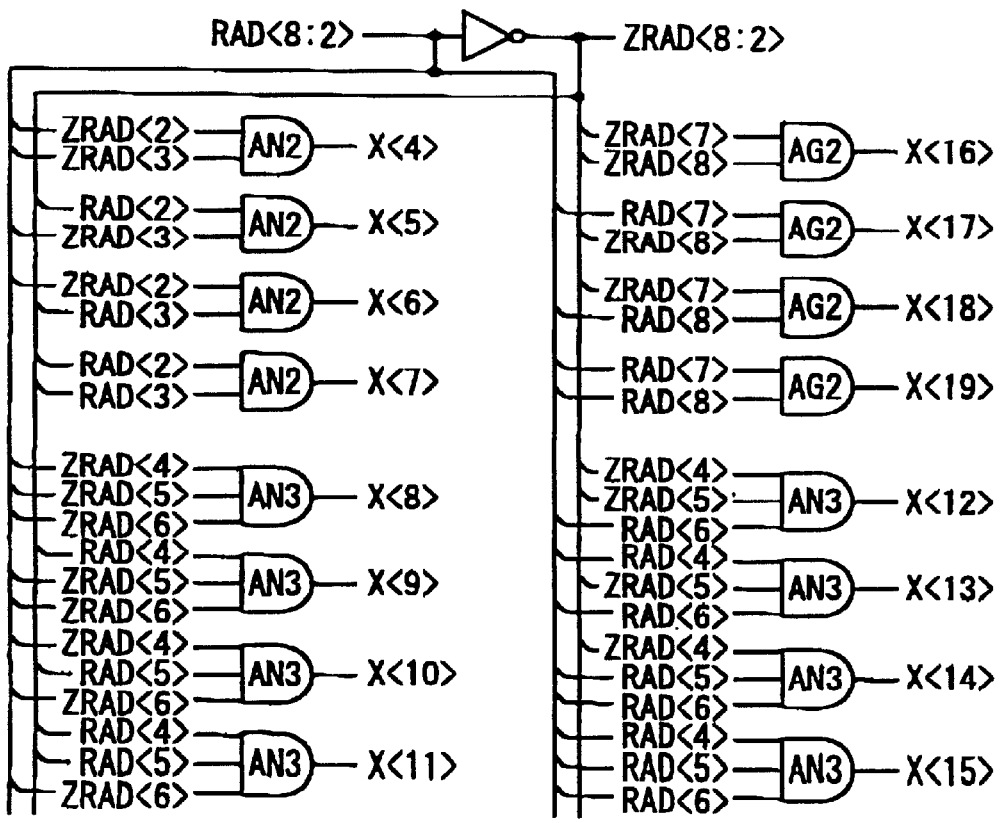
FIG. 11 illustrates a structure of a 7-bit predecode circuit shown in FIG. 9.

FIG. 11 illustrates a structure of 7-bit predecode circuit 2j shown in FIG. 9. Referring to FIG. 11, predecode signals X<4>–X<19> are generated according to row address bits RAD<8:2> and inverted row address bits ZRAD<8:2> from level latch circuit 2f. Predecode signals X<7:4> is generated by a 2-input AND circuit AN2 receiving row address bits RAD<3:2> and ZRAD<3:2>. Predecode signals X<15:8> are generated by a 3-input AND circuit AN3 receiving a predetermined combination of row address bits RAD<6:4> and ZRAD<6:4>. Predecode signals X<19:16> are generated by a 2-input AND circuit AG2 receiving a predetermined set of row address bits RAD<8:7> and ZRAD<8:7>.

For example, predecode signal X<4> is driven into the active state when both of address bits ZRAD<3> and ZRAD<2> are at H level. Predecode signal X<8> is driven into the H level when all of the row address bits ZRAD<6>, ZRAD<5> and ZRAD<4> are at H level. Predecode signal X<16> is driven into the H level when both of the row address bits ZRAD<8> and ZRAD<7> are at H level.

7-bit predecode circuit 2j merely performs decoding operation according to latched row address bits RAD<8:2>. Immediately after internal clock signal CLKR rises to H level, decoding operation is performed and thus high speed driving of the predecode signal to the definite state is possible.

Structure of Row Decoder

Figure 12:
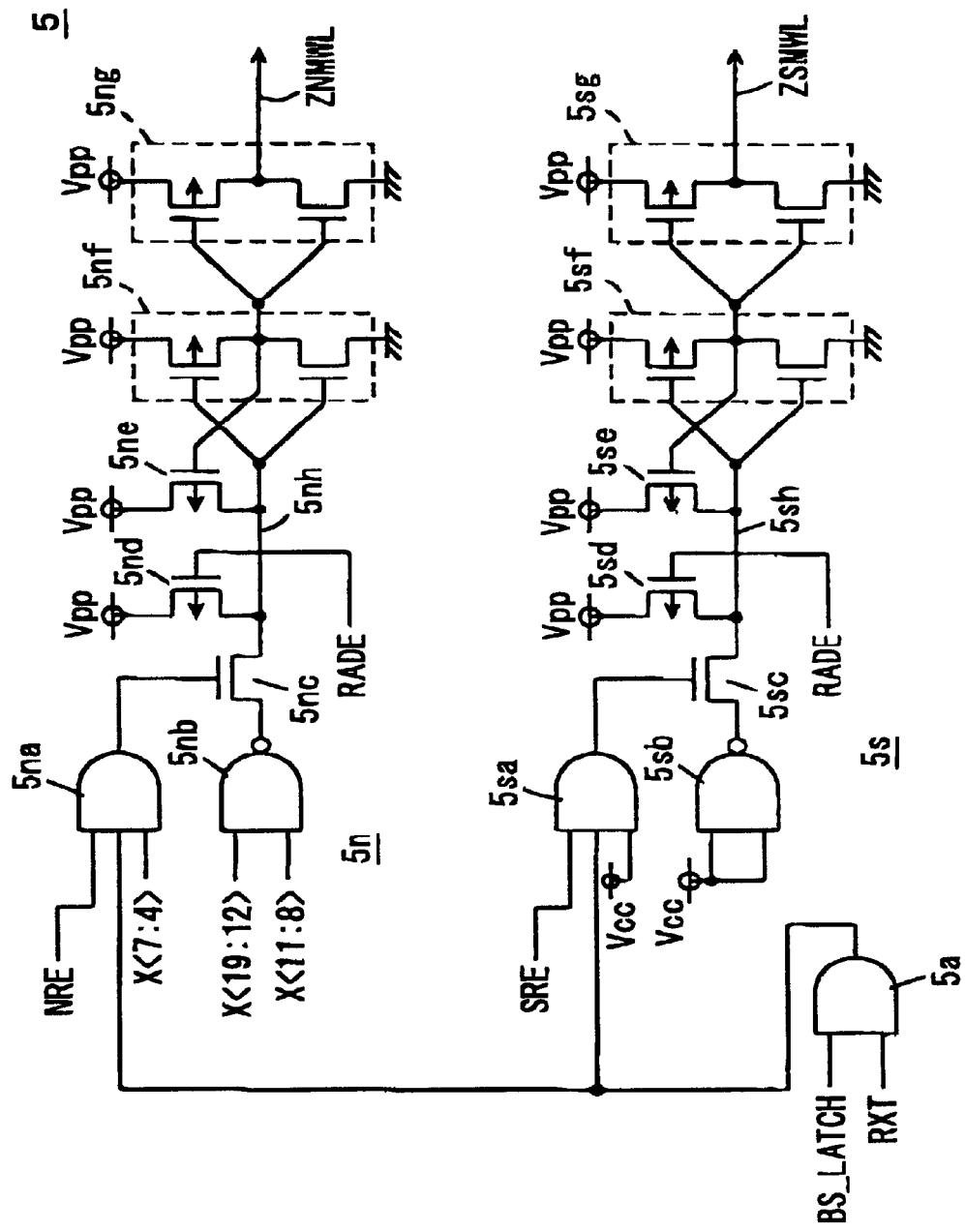
FIG. 12 illustrates a structure of a word line drive circuit included in a row decoder shown in FIG. 1.

FIG. 12 illustrates a structure of row decoder 5 provided for each memory sub block. In row decoder 5, a normal main word line drive circuit 5n for driving normal main word line ZNMWL and a spare main word line drive circuit 5s for driving spare main word line ZSMWL into the selected state are provided. In order to activate row decoder 5 in each memory sub block individually, an AND circuit 5a receiving latch block selection signal BS_LATCH and word line activation signal RXT is provided. AND circuit 5a transmits a word line activation signal in only a selected memory sub block.

Normal word line drive circuit 5n includes an NAND circuit 5nb receiving one bit of predecode signals X<19:12> and one bit of predecode signals X<11:8>, an AND circuit 5na receiving a word line activation signal from AND circuit 5a, normal row enable signal NRE from associated preprocessing circuit 2, and one bit of predecode signal X<7:4>, a transfer gate 5nc made conductive, when an output signal of AND circuit 5na is at H level, to pass an output signal of NAND circuit 5nb, a P channel MOS transistor 5nd made conductive, when row address enable signal RADE is inactivated, to transmit high voltage Vpp to a node 5nh, a CMOS inverter 5nf receiving high voltage Vpp as one operating supply voltage for operation to inverter signal on node 5nh, a CMOS inverter 5ng receiving high voltage Vpp as one operating supply voltage for operation to invert an output signal of inverter 5nf and drive normal main word line ZNMWL, and a P channel MOS transistor 5ne made conductive, when an output signal of CMOS inverter 5nf is at L level, to transmit high voltage Vpp to node 5nh.

Spare main word line drive circuit 5s includes an NAND circuit 5sb receiving supply voltage Vcc on both inputs, an AND circuit 5sa receiving an output signal of AND circuit 5a, spare row enable signal SRE and supply voltage Vcc, a transfer gate 5sc made conductive, when an output signal of AND circuit 5sa is at H level, to transmit an output signal of NAND circuit 5sb to a node 5sh, a P channel MOS transistor 5sd made conductive, when row address enable signal RADE is inactivated, to transmit high voltage Vpp to node 5sh, a CMOS inverter 5sf operating using high voltage Vpp as one operating supply voltage to invert a signal on node 5sh, a CMOS inverter 5sg inverting an output signal of inverter 5sf to drive spare main word line ZSMWL into the selected state, and a P channel MOS transistor 5se made conductive, when an output signal of inverter 5sf is at L level, to transmit high voltage Vpp to node 5sh.

In order to realize the same load condition in NAND circuit 5sb as that in NAND circuit 5nb receiving predecode signal in normal main word line drive circuit 5n, NAND circuit 5sb is supplied with power supply voltage Vcc at both inputs thereof. NAND circuit 5sb outputs a signal which always indicates a selected state of L level. Power supply voltage Vcc is supplied as an input signal to AND circuit 5sa in order to realize correspondence to the state that one bit of predecode signals X<7:4> is supplied to AND circuit 5na in normal main word line drive circuit 5n. Supply voltage Vcc is applied as input signals to AND circuits 5sa and NAND circuit 5sb in order to realize the same load condition in normal main word line drive circuit 5n and spare main word line drive circuit 5s to realize the same timing of sub word line selection between the spare main word line selection and the normal main word line selection.

In a non-selected bank, row address enable signal RADE is in the inactive state of L level, MOS transistors 5nd and 5sd are in the ON state and nodes 5nh and 5sh are charged to high voltage Vpp level. Accordingly, normal main word line ZNMWL and spare main word line ZSMWL are both maintained at high voltage Vpp level to stay in the non-selected state.

In a selected bank, row address enable signal RADE is activated at a predetermined timing to attain H level and MOS transistors 5nd and 5sd are turned off. In a non-selected memory cell block, latch block selection signal BS_LATCH is at L level, an output signal of AND circuit 5a stays at L level and accordingly both of the output signals of AND circuits 5na and 5sa are at L level. Transfer gates 5nc and 5sc are thus maintained in the OFF state. Even if MOS transistors 5nd and 5sd are turned off, output signals of CMOS inverters 5nf and 5sf are at L level, MOS transistors 5ne and 5se are in the ON state and both of nodes 5nh and 5sh are charged to high voltage Vpp level. In this way, nodes 5nh and 5sh are prevented from attaining an electrically floating state in a non-selected memory block of a selected bank.

When a corresponding memory sub block in a selected bank is selected, latch block selection signal BS_LATCH attains H level and an output signal of AND circuit 5a is driven into the active state according to the activation of word line activation signal RXT. If an access is made to a normal memory cell row, normal row enable signal NRE attains H level and spare row enable signal SRE falls to L level. When a corresponding normal main word line ZNMWL is addressed, an output signal of NAND circuit 5nb is at L level, an output signal of AND circuit 5na attains H level, node 5nh falls to L level and responsively normal main word line ZNMWL is driven into the ground voltage level.

In this state, an output signal of CMOS inverter 5nf attains high voltage Vpp level of H level, MOS transistor 5ne is turned off and node 5nh is surely maintained at the ground voltage level by NAND circuit 5nb. When normal main word line ZNMWL is not selected, an output signal of NAND circuit 5na reaches L level or an output signal of NAND circuit 5nb attains H level. If an output signal of AND circuit 5na is at H level and an output signal of NAND circuit 5nb is at H level, node 5nh is maintained at high voltage Vpp level by MOS transistor 5ne. Voltage of supply voltage Vcc level is transmitted to the control gate of transfer gate 5nc so that NAND circuit 5nb is never influenced adversely by high voltage Vpp. When an output signal of AND circuit 5na is at L level, this corresponds to the precharge state so that an output signal of NAND circuit 5nb is not transmitted and node 5nh is maintained at high voltage Vpp level by MOS transistor 5ne.

When a defective bit address is designated, spare row enable signal SRE attains H level and accordingly transfer gate 5sc is turned on. Then node 5sh is driven to the ground voltage level by NAND circuit 5sb and accordingly spare main word line ZSMWL is driven into the selected state of the ground voltage level.

Row decoder 5 is arranged in the vicinity of the preprocessing circuit and predecode signals X<19:4> are transmitted through a short distance. Thus, after a predecode signal is defined, decoding can be done speedily to drive a spare or normal main word line into the selected state.

Structure of Sub Decode Signal Driver

Figure 13:
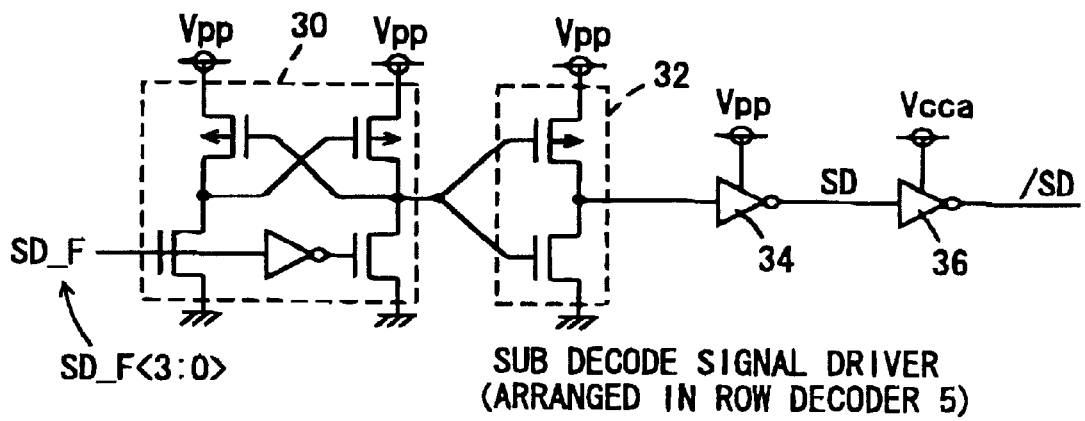
FIG. 13 illustrates a structure of a sub decode signal driver included in the row decoder shown in FIG. 1.

FIG. 13 illustrates one example of a structure of a sub decode signal driver provided in row decoder 5. Referring to FIG. 13, the sub decode signal driver includes a level conversion circuit 30 converting sub decode fast signal SD_F at a peripheral supply voltage level supplied from an associated preprocessing circuit to a signal having the amplitude of high voltage Vpp level, a CMOS inverter 32 receiving high voltage Vpp as one operating supply voltage to invert an output signal of level conversion circuit 30, an inverter 34 operating using high voltage Vpp as one operating supply voltage, to invert an output signal of CMOS inverter 32 and generate sub decode signal SD, and an inverter 36 receiving array supply voltage Vcca as one operating supply voltage, to invert sub decode signal SD from inverter 34 and to generate complementary sub decode signal /SD.

Sub decode fast signal SD_F corresponds to a signal of one bit of 4-bit sub decode fast signals SD_F<3:0>, and the sub decode signal driver shown in FIG. 13 is arranged corresponding to each bit of the sub decode fast signals. As shown in the conventional hierarchical word line structure shown in FIG. 32, four sub word lines (normal/spare sub word lines) are provided to one main word line (spare/normal main word line) and one sub word line is designated by a sub decode signal. As shown in FIG. 9, sub decode fast signal SD_F has already been generated by combination with block selection signal BS. Sub decode fast signal SD_F is driven according to predecode signals X<3:0> for only a selected memory sub block. The sub word line driver described below has a structure requiring both of the sub decode signals SD and /SD. Therefore, sub decode signals SD and /SD complementary to each other are employed.

When sub decode fast signal SD_F is at H level, an output signal of level conversion circuit 30 is at high voltage Vpp level. On the other hand, when sub decode fast signal SD_F is at L level, the output signal of level conversion circuit 30 is at the ground voltage level of L level. Accordingly, sub decode signal SD is at high voltage Vpp level in the selected state and at the ground voltage level in the non-selected state. Complementary sub decode signal /SD is at the ground voltage level of L level when a corresponding sub word line is selected and at array supply voltage Vcca level of H level when a corresponding sub word line is in the non-selected state. The amplitude of complementary sub decode signal /SD is set at array supply voltage Vcca level since complementary sub decode signal /SD is merely used for driving a non-selected sub word line into the ground voltage level and complementary sub decode signal /SD is not used for passing high voltage Vpp. The sub decode signal driver transmits sub decode signals SD and /SD to a sub word line driver provided in a corresponding memory sub block.

Structure of Memory Array Portion

Figure 14:
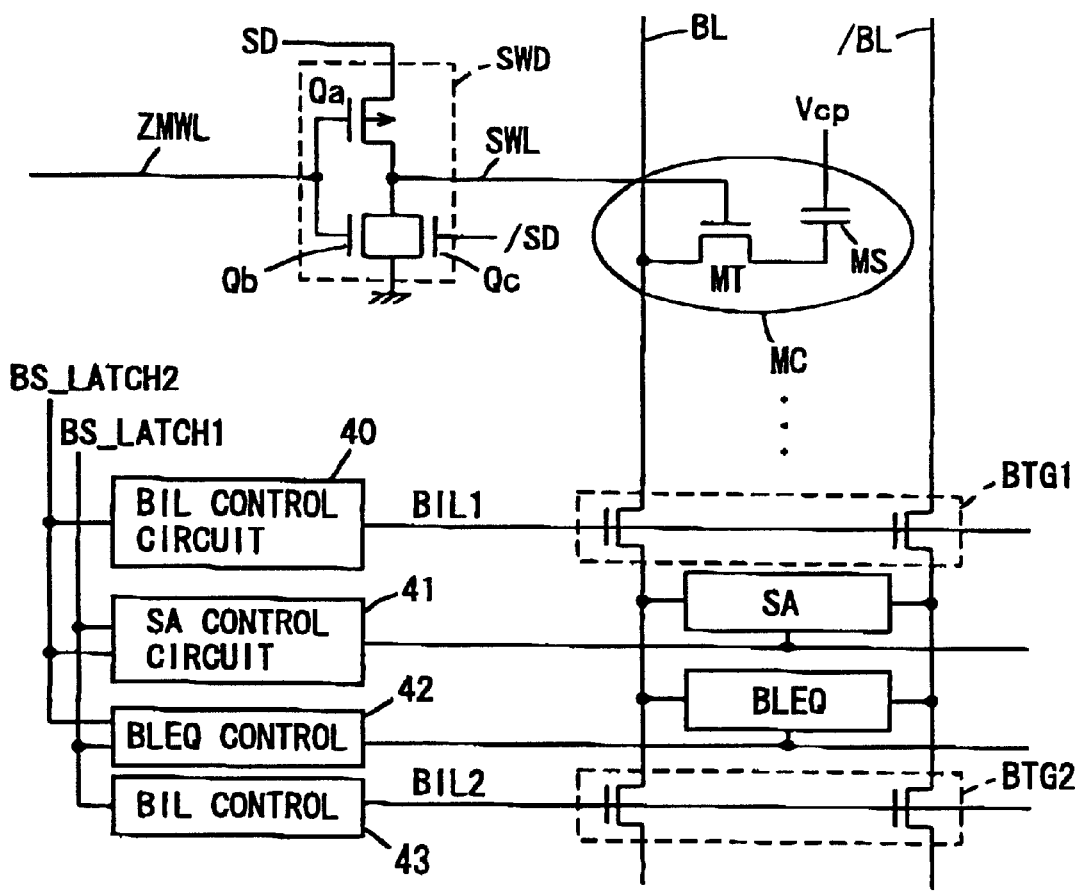
FIG. 14 is a schematic diagram illustrating a structure of a memory array shown in FIG. 1.

FIG. 14 is a schematic diagram illustrating a structure of a memory array portion. FIG. 14 representatively shows a sub word line SWL and a pair of bit lines BL and /BL associated with one memory cell MC and corresponding peripheral circuitry. Memory cell MC includes a memory capacitor MS receiving cell plate voltage Vcp at one electrode and storing information, and a memory transistor MT which is turned on in response to signal potential on sub word line SWL to couple memory capacitor MS onto associated bit line BL. At a crossing of sub word line SWL and one of bit lines BL and /BL, memory cell MC is arranged.

For sub word line SWL, a sub word line driver SWD is arranged which responds to signal potential on main word line ZMWL to drive sub word line SWL into the selected or non-selected state. The structure of the sub word line driver SWD and memory cell MC is common to the normal memory cell row and to spare memory cell row. Therefore, FIG. 14 generally shows main word line ZMWL and sub word line SWL. Main word line ZMWL represents normal main word line ZNMWL and spare main word line ZSMWL and sub word line SWL represents normal sub word line NSWL and spare sub word line SSWL.

Sub word line driver SWD includes a P channel MOS transistor Qa which transmits sub decode signal SD to sub word line SWL when signal potential on main word line ZMWL is at L level, an N channel MOS transistor Qb which is turned on, when signal potential on main word line ZMWL is at H level, to drive sub word line SWL into the ground voltage level, and an N channel MOS transistor Qc which is selectively turned on responsive to complementary sub decode signal /SD, to drive sub word line SWL into the ground voltage level.

In sub word line driver SWD, when signal potential on main word line ZMWL is in the non-selected state of H level, MOS transistor Qa is turned off and MOS transistor Qb is turned on so that sub word line SWL is maintained at the ground voltage level.

When signal potential on main word line ZMWL is at L level, MOS transistor Qb is turned off. When sub decode signal SD is at high voltage Vpp level, MOS transistor Qa is turned on to transmit sub decode signal SD of high voltage Vpp level onto sub word line SWL. At this time, complementary sub decode signal /SD is at ground voltage level, MOS transistor Qc is in the OFF state, and sub word line SWL is surely driven into the high voltage Vpp level. On the other hand, when main word line ZMWL is at L level and sub decode signal SD is also at L level, MOS transistor Qa has the source and gate at the same voltage level and is thus turned off. At this time, complementary sub decode signal /SD is at H level (array supply voltage Vcca level) and sub word line SWL is maintained at ground voltage level. Complementary sub decode signal /SD is used for maintaining sub word line SWL at the ground voltage level. Therefore, the amplitude of high voltage Vpp level of complementary sub decode signal /SD is unnecessary and thus complementary sub decode signal /SD is generated by using stable array supply voltage Vcca.

For bit lines BL and /BL, a bit line isolation gate BTG1 which selectively becomes conductive in response to bit line isolation instruction signal BIL1, a sense amplifier circuit SA and a bit line equalize circuit BLEQ which are connected respectively to bit lines BL and /BL via bit line isolation gate BTG1, and a bit line isolation gate BTG2 which selectively becomes conductive, in response to bit line isolation instruction signal BIL2, to connect sense amplifier circuit SA and bit line equalize circuit BLEQ to paired bit lines of another memory sub block (not shown) are provided.

A BIL control circuit 40, an SA control circuit 41, a BLEQ control circuit 42 and a BIL control circuit 43 are provided to bit line isolation gate BTG1, sense amplifier circuit SA, bit line equalize circuit BLEQ and bit line isolation gate BTG2, respectively. Latch block selection signals BS_LATCH2 and BS_LATCH 1 are provided to BIL control circuits 40 and 43, respectively. Latch block selection signals BS_LATCH2 and BS_LATCH 1 are both provided to each of SA control circuit 41 and BLEQ control circuit 42.

When the associated memory sub block includes a selected sub word line SWL, bit line isolation gate BTG1 becomes conductive. Bit line isolation gate BTG1 becomes nonconductive when a sub word line of an adjacent memory sub block (not shown) is selected. Bit line isolation gate BTG2 enters the OFF state when main word line ZMWL and sub word line SWL shown in FIG. 14 are selected. Sense amplifier circuit SA is shared by memory sub blocks adjacent to each other and activated when one of the memory sub blocks connected via bit line isolation gates BTG1 and BTG2 is selected. Bit line equalize circuit BLEQ also enters the inactive state when one of the memory sub blocks connected to bit line isolation gates BTG1 and BTG2 is selected.

The so-called shared sense amplifier structure in which sense amplifier circuit SA and bit line equalize circuit BLEQ are shared by memory sub blocks adjacent to each other is implemented only in the same bank. If memory sub blocks adjacent to each other belong to different banks, sense amplifier circuits are provided for those memory sub blocks, respectively.

Structure of Memory Sub Block

Figure 15:
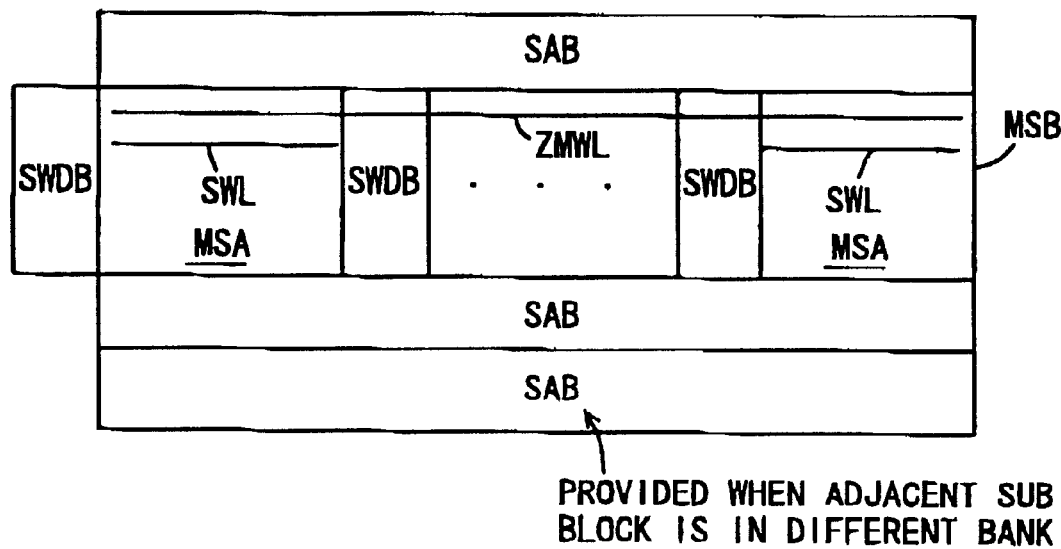
FIG. 15 is a schematic diagram illustrating a structure of a memory sub block shown in FIG. 1.

FIG. 15 is a schematic diagram illustrating a structure of one memory sub block MSB. Referring to FIG. 15, memory sub block MSB is divided into a plurality of memory sub arrays MSAs in the row direction. A sub word driver band SWDB is arranged between memory sub arrays adjacent to each other in the row direction. Sub word line driver SWD shown in FIG. 14 is arranged corresponding to each sub word line SWL in sub word driver band SWDB. Main word line ZMWL extending in the row direction is arranged commonly to memory sub arrays MSAs included in memory sub block MSB. Sub word line SWL extending in the row direction in memory sub array MSA is connected to memory cell MC of one row in a corresponding memory sub array MSA. On both sides of memory sub block MSB in the column direction, sense amplifier bands SABs are arranged and a sense amplifier circuit is arranged corresponding to each column of memory sub array MSA in each sense amplifier band SAB. Sense amplifier circuits may be arranged alternately at every other column in sense amplifier bands SABs on both sides of memory sub block MSB. If a memory sub block adjacent to memory sub block MSB is in a different bank, sense amplifier band SAB is used only by this memory sub block MSB and a non-shared type sense amplifier arrangement is implemented in this case.

Modification

Figure 16:
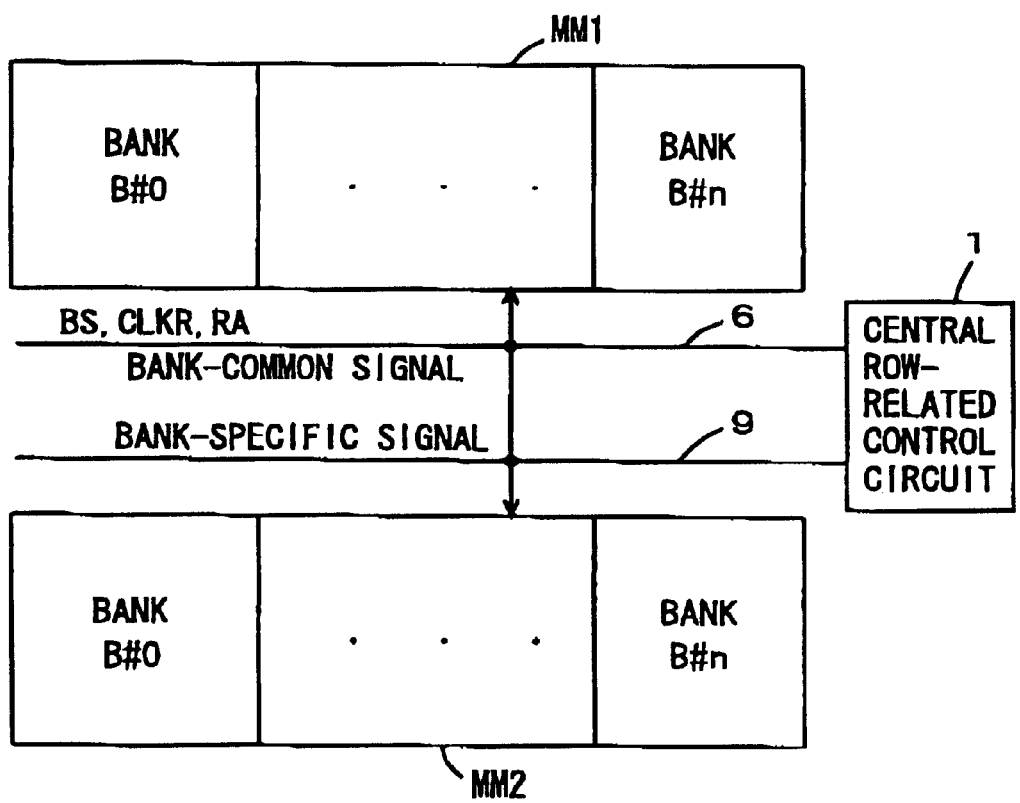
FIG. 16 is a schematic diagram illustrating a structure of a modification of the first embodiment.

FIG. 16 is a schematic diagram showing illustrating a modification of the first embodiment of the invention. Referring to FIG. 16, each of memory mats MM1 and MM2 is divided into a plurality of banks B#0–B#n. Each of banks B#0–B#n includes a plurality of memory sub blocks in a corresponding memory array. Bank-common signal (block selection signal BS, internal clock signal CLKR and row address signal RA) from central row-related control circuit 1 is transmitted via a bank-common signal bus 6 to memory mats MM1 and MM2. A bank-specific signal from central row-related control circuit 1 is transmitted via a bank-specific signal bus 9 to each of banks B#0–B#n.

Even if the number of banks B#0–B#n increases in memory mats MM1 and MM2, the number of signals transmitted via bank-common signal bus 6 does not change and the number of control signals transmitted onto bank-specific signal bus 9 (row-related operation control signals) increases according to the number of banks, but the increase of the number of bank-specific control signals is extremely smaller than that of the configuration in which address signal bits are provided to each bank. Therefore, even if the number of banks B#0–B#n increases, the area occupied by signal lines does not increase so that this modification is easily adaptable to increase of the banks. When the banks are increased in number, the bank-common signals are fixed in number, and the number of bank control circuits generating row-related operation control signals for each bank in central row-related control circuit 1 increases. Then adaptation to the increase of the number of banks is easily achieved. Further, the lines of these control signals transmit respective signals from central row-related control circuit 1 provided on one side of memory mats MM1 and MM2 in one direction. Therefore, adaptation to the bank expansion is easily realized without significantly changing the line layout.

As heretofore discussed, according to the first embodiment of the invention, an externally supplied row address signal is transmitted to each memory sub block of the memory mat asynchronously with the clock signal and the row address signal is latched synchronously with the internal clock signal in each memory sub block so as to start an internal operation. Therefore, an address signal can be propagated utilizing the set up time of the address signal to achieve a high speed operation. Further, the spare determination is made according to an address signal transmitted asynchronously with the clock signal so that the spare determination can be performed utilizing the address set up time. The result of the spare determination has already been defined when a word line is selected, and thus the word line can be driven into the selected state at high speed to shorten the row access time.

The internal clock signal, the block selection signal, and the row address are transmitted commonly to a plurality of banks. Therefore, change of the layout of interconnection lines for the bank-common signals is unnecessary even when the number of banks is increased, and adaptation to the bank expansion is easily accomplished.

In addition, the block selection signal for specifying a memory sub block is generated according to a row address in the central row-related control circuit and the block selection signal is held for one cycle period of the clock signal. Consequently, a selected block can be driven correctly into the selected state in each memory sub block (a sufficient timing margin can be secured). Even if the block selection signal is transmitted commonly to banks, a selected memory sub block in a selected bank can be driven accurately into the selected state.

Second Embodiment

Figure 17:
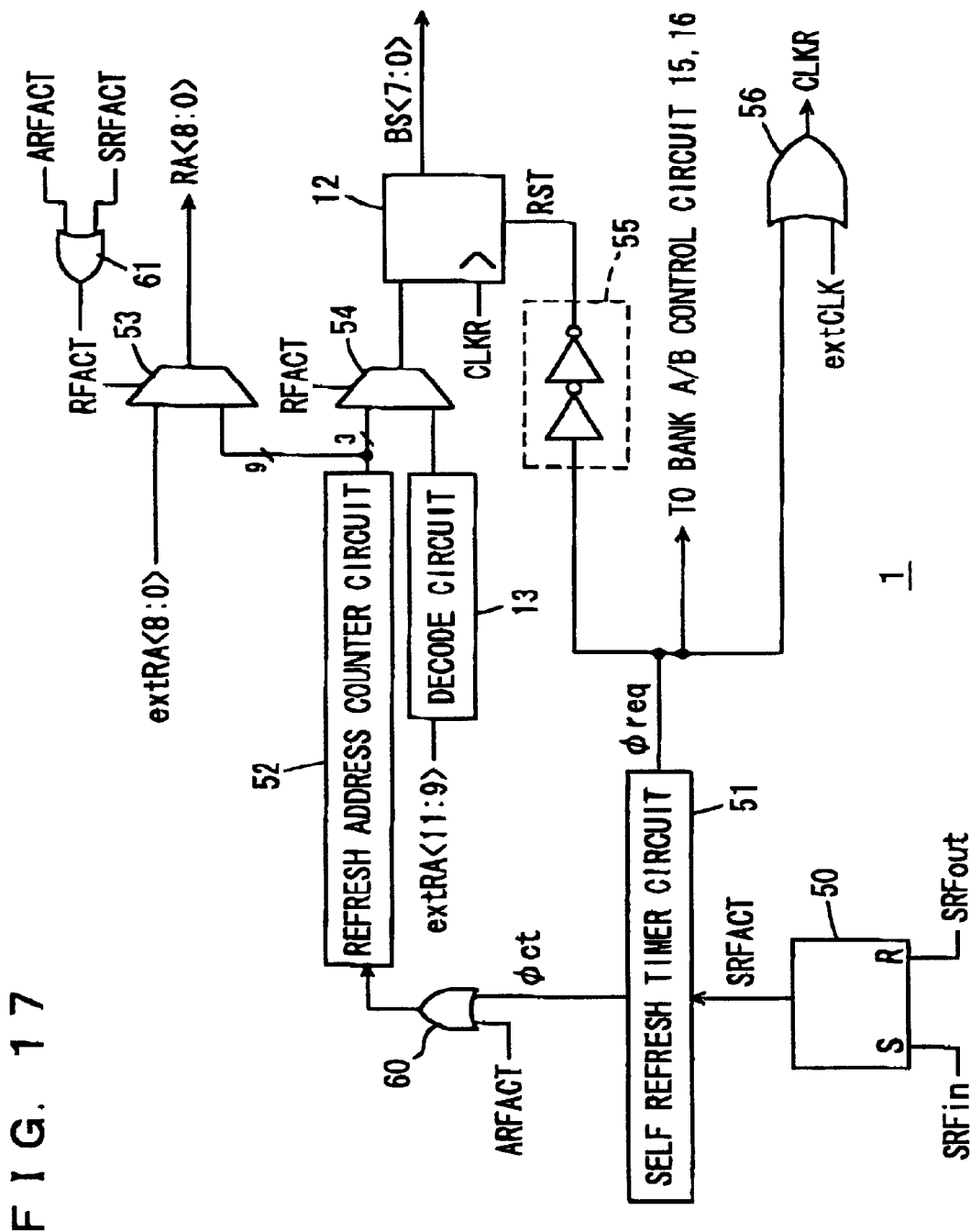
FIG. 17 is a schematic diagram illustrating a structure of a main portion of a semiconductor memory device in a second embodiment of the invention.

FIG. 17 illustrates a structure of a main portion of a semiconductor memory device according to the second embodiment of the invention. FIG. 17 shows a structure of a portion related to refresh of a central row-related control circuit 1. Referring to FIG. 17, central row-related control circuit 1 includes: a set/reset flip-flop 50 which is set in response to activation of self refresh instruction command SRFin and reset in response to activation of self refresh exit command SRFout; a self refresh timer circuit 51 which is started upon activation of self refresh activation signal SRFACT from set/reset flip-flop 50 to generate refresh request signal φreq at a predetermined interval (e.g. 16 μs); a refresh address counter circuit 52 which performs counting operation according to an address count signal from an OR circuit 60 receiving count up instruction signal φct from self refresh timer circuit 51 and auto refresh activation signal ARFACT activated upon application of the auto refresh instruction command and generates a refresh address; a multiplexer 53 which selects one of lower order 9-bit count value of refresh address counter circuit 52 and externally supplied row address signal extRA<8:0>; a multiplexer 54 which selects one of higher order 3-bit count value from refresh address counter circuit 52 and a block selection signal from a block decode circuit 13; an OR circuit 56 which generates internal clock signal CLKR according to refresh request signal φreq and external clock signal extCLK; a block latch circuit 12 which responds to rising of internal clock signal CLKR for latching an output signal of multiplexer 54 to generate 8-bit clock selection signal BS<7:0>; and a delay circuit 55 which delays refresh request signal φreq by a predetermined time to reset block latch circuit 12.

Multiplexers 53 and 54 execute selecting operation according to refresh activation signal RFACT from OR circuit 61 receiving auto refresh command (auto refresh activation instruction signal) ARFACT and self refresh activation signal SRFACT.

In the structure shown in FIG. 17, block decode circuit 13 predecodes externally supplied 3-bit row address extRA<11:9> to generate a block selection signal. Then, block latch circuit 12 latches the block selection signal from block decode circuit 13 supplied via multiplexer 54 according to internal clock signal CLKR and generates block selection signals BS<7:0>. This arrangement is opposite to the arrangement shown in FIGS. 2 and 5 in the order of components.

When refresh activation signal RFACT from OR circuit 61 is in the active state, multiplexers 53 and 54 select output count bits from refresh address counter 52.

In the normal operation mode, self refresh timer circuit 51 is in the inactive state and refresh request signal φreq is also in the inactive state. Multiplexers 53 and 54 select externally supplied row address bits extRA<8:0> and an output signal of block decode circuit 13, respectively. OR circuit 56 generates internal clock signal CLKR according to external clock signal extCLK. Reset signal RST from delay circuit 55 is always in the inactive state since refresh request signal φreq is fixed in the inactive state. Block latch circuit 12 latches an output signal of block decode circuit 13 supplied via multiplexer 54 for one clock cycle period according to internal clock signal CLKR.

Figure 18:
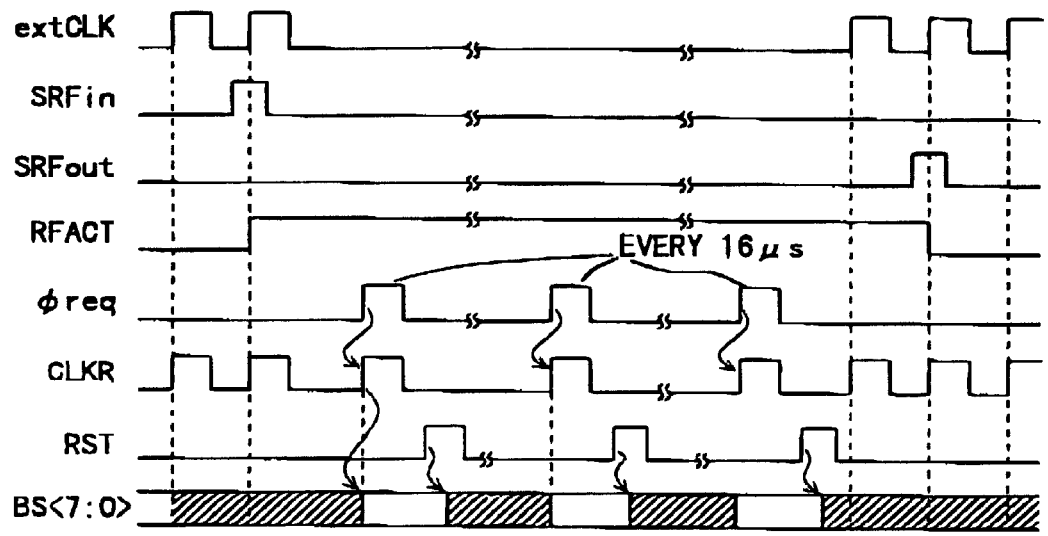
FIG. 18 is a timing chart illustrating an operation of the circuit shown in FIG. 17.

An operation of the central row-related control circuit shown in FIG. 17 in the self refresh mode is now described in conjunction with FIG. 18. When self refresh command SRFin is supplied in synchronization with external clock signal extCLK, set/reset flip-flop 50 is set and self refresh activation signal SRFACT is activated. Self refresh timer circuit 51 includes an oscillation circuit and a count circuit, for example, activates the oscillating operation of the internal oscillation circuit, and counts the number of oscillation clocks to determine the refresh interval. When a predetermined time has passed, self refresh timer circuit 51 activates refresh request signal φreq. Multiplexers 53 and 54 are set in a state for selecting output count bits of refresh address counter circuit 52 according to refresh activation signal RFACT from OR circuit 61.

Accordingly, row address bits RA<8:0> and block selection signals BS<7:0> are generated according to refresh address count value from refresh address counter circuit 52. According to refresh request signal φreq, internal clock signal CLKR is generated from OR circuit 56 and block selection signals BS<7:0> from block latch circuit 12 is reset when a predetermined time has passed. In this way, block selection signals BS<7:0> are maintained in the latched state in the period corresponding to one clock cycle period even in the self refresh mode. Thereafter, count up instruction signal φct is activated at an appropriate timing and accordingly an address count signal supplied from OR circuit 60 to refresh address counter circuit 52 is activated and the count value of refresh address counter circuit 52 is incremented or decremented.

In this self refresh mode, logic of an external processor and the like is in the sleep mode so that generation of external clock signal extCLK is stopped. In this case, internal clock signal CLKR is generated according to refresh request signal φreq so as to supply the internal clock signal to each bank control circuit in the central row-related control circuit for generating row-related control signals that are activated in a predetermined period.

When the self refresh mode is completed, self refresh exit command SRFout is activated, set/reset flip-flop 50 is reset, self refresh activation signal SRFACT is inactivated, and refresh timer circuit 51 stops counting, to complete the self refresh operation. When the self refresh is exited, external clock signal extCLK has already been generated and self refresh cancel command SRFout is supplied synchronously with external clock signal extCLK. Even after the self refresh mode is exited, the self refresh could be carried out internally. Therefore, the access to the semiconductor memory device is inhibited for a period of a predetermined number of clock cycles.

As shown in FIG. 17, internal clock signal CLKR is generated according to self refresh request signal φreq in the self refresh mode. Then, even if internal clock signal CLKR, row address bit and the block selection signal are supplied from the central row-related circuit commonly to banks, each memory sub block can perform the refresh operation according to the internal clock signal or the self refresh request signal.

Figure 19:
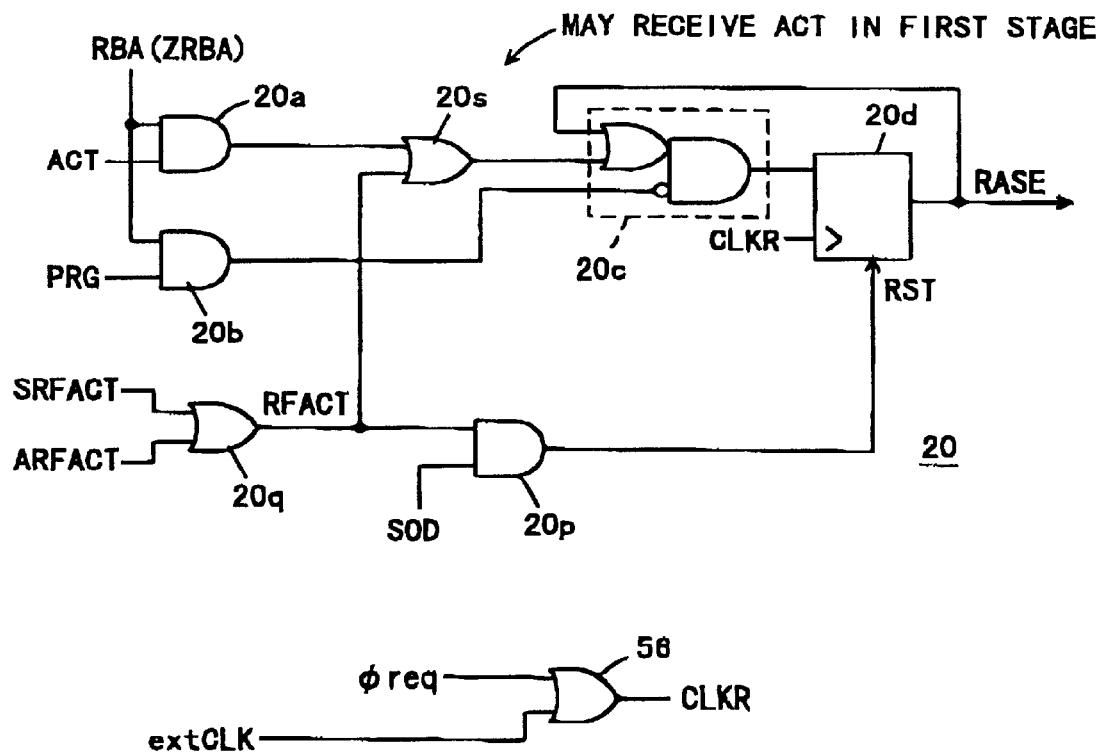
FIG. 19 is a schematic diagram illustrating a structure of a bank control circuit in the second embodiment of the invention.

FIG. 19 shows one example of a structure of bank control circuit 20. Referring to FIG. 19, bank control circuit 20 includes an OR circuit 20q receiving self refresh activation signal SRFACT and auto refresh activation signal ARFACT, and an OR circuit 20s arranged between an AND circuit 20a and a composite gate circuit 20c and receiving an output signal of AND circuit 20a and refresh activation signal RFACT from OR circuit 20q. An output signal of AND circuit 20p receiving refresh activation signal RFACT and sense amplifier operation completion instruction signal SOD is supplied to an up edge trigger type latch circuit 20d as reset signal RST. Sense amplifier operation completion instruction signal SOD is activated when a memory cell row is selected, sensing operation is performed, and re-storing of data into a memory cell is done to complete refresh of memory cell data.

When refresh activation signal RFACT is activated, OR circuit 20s and composite gate circuit 20c in combination generate a signal of H level, and bank activation signal RASE from latch circuit 20d is activated according to internal clock signal CLKR generated according to activation of refresh request signal φreq. When sense amplifier operation completion instruction signal SOD is activated, an output signal of AND circuit 20p attains the active state, latch circuit 20d is reset, and bank activation signal RASE is inactivated to complete the refresh operation.

In the structure shown in FIG. 19, bank activation signal RASE is activated commonly to all banks. If the self refresh operation is carried out in each bank, an output signal of the OR circuit receiving active command ACT and refresh request signal φreq is supplied to AND circuit 20a. The bank address signal is generated from refresh address counter circuit 52. In this way, refresh operation can be carried out in each bank.

Auto refresh is realized when auto refresh command ARF is supplied and auto refresh activation signal ARFACT is activated. Refresh operation is also performed according to a refresh address from refresh address counter 52 when the auto refresh command is supplied. OR circuit 60 allows adaptation to both of the auto refresh and self refresh.

According to the second embodiment of the invention, the internal clock signal is generated according to the refresh request signal in the self refresh mode as described above. Therefore, even if the external clock signal is not supplied in the self refresh mode, the refresh operation can be ensured according to the self refresh request.

Third Embodiment

FIGS. 20A–20C illustrate a structure of a main portion of a semiconductor memory device according to the third embodiment of the invention. FIGS. 20A–20C illustrate a structure of level latch circuits 2f and 2i in the preprocessing circuit shown in FIG. 9.

Referring to FIG. 20A, level latch circuit 2f includes: a transmission gate 2fa which becomes conductive, upon inactivation of latch instruction signal RXLATCH, to pass inverted row address bits /RA<8:2>; an NAND circuit 2fb which receives a wafer burn-in mode instruction signal /WBI and the row address bits passing through transmission gate 2fa; an NAND circuit 2fd which receives an output signal of NAND circuit 2fb and wafer burn-in mode instruction signal /WBI to generate complementary address bits ZRAD<8:2>; and an inverter circuit 2fc which inverts an output bit of NAND circuit 2fb and transmits the inverted bits to the input of NAND circuit 2fb.

Inverted row address bits /RA<8:2> are the output bits of up edge trigger type latch circuit 2c shown in FIG. 9. Wafer burn-in mode instruction signal /WBI attains the active state of L level in wafer burn-in mode. The wafer burn-in mode is a test mode for performing a burn-in test simultaneously for all chips on a wafer after completion of the wafer process. In the wafer burn-in test, the chips on a wafer are simultaneously subjected to the burn-in test that is different from the burn-in test performed after packaging, and a burn-in tester having a simple circuit structure is employed. Therefore, the required minimum number of control signals are utilized to perform the burn-in test.

In level latch circuit 2f shown in FIG. 20A, all the address bits RAD<8:2> output from NAND circuit 2fb attain H level and complementary address bits ZRAD<8:2> output from NAND circuit 2fd attain H level in the wafer burn-in mode. In this way, all main word lines designated by 7-bit row address are driven into the selected state.

Referring to FIG. 20B, a level latch circuit 2iE includes a CMOS transmission gate 2ia passing predecode signals /X<2,0> of 2 bits when latch instruction signal RXLATCH is inactivated, an NAND circuit 2ib receiving wafer burn-in control signal /WBI_E and predecode signals passing through CMOS transmission gate 2ia, an NAND circuit 2ic receiving wafer burn-in mode instruction signal WBI and wafer burn-in control signal /WBI_E, and an NAND circuit 2id receiving an output bit of NAND circuit 2ib and an output bit of NAND circuit 2ic to supply the output signal to the input of NAND circuit 2ib. Even number predecode signals XL<2,0> of 2 bits are output from NAND circuit 2ib.

In the wafer burn-in mode, NAND circuit 2ic operates as an inverter. When wafer burn-in control signal /WBI_E is at H level, the output signal of NAND circuit 2*ic* is at L level and accordingly the output signal of NAND circuit 2*id* is at H level. In this state, even number predecode signals XL<2, 0> from NAND circuit 2*ib* are at L level. According to predecode signals XL<2,0>, sub decode signals SD<2> and SD<0> are generated. When wafer burn-in control signal /WBI_E is at L level, the output signal of NAND circuit 2*ic* is at H level, NAND circuit 2*id* operates as an inverter, and predecode signals XL<2,0> at H level are generated from NAND circuit 2*ib*. Thus, wafer burn-in control signal /WBI_E is set at L level in the wafer burn-in mode so as to drive even number sub word lines (memory cells of even number rows) into the selected state.

FIG. 20C illustrates a portion corresponding to odd number predecode signals in level latch circuit 2*i*. Referring to FIG. 20C, a level latch circuit 2*i*O includes: a CMOS transmission gate 2*ie* which becomes conductive, when latch instruction signal RXLATCH is at L level, to pass odd number predecode signals /X<3,1>; an NAND circuit 2*if* which receives second wafer burn-in control signal /WBI_O and a predecode signal passing through CMOS transmission gate 2*ie*; an NAND circuit 2*ig* which receives wafer burn-in mode instruction signal WBI and second wafer burn-in control signal /WBI_O; and an NAND circuit 2*ih* which receives an output signal of NAND circuit 2*if* and an output signal of NAND circuit 2*ig* for transmission to the input of NAND circuit 2*if*. Odd number predecode signals XL<3,1> of 2 bits are output from NAND circuit 2*if*.

In level latch circuit 2*i*O shown in FIG. 20C, when the wafer burn-in control signal /WBI_O is in the inactive state of H level in wafer burn-in mode, odd number predecode signals XL<3,0> are at L level. When wafer burn-in control signal /WBI_O is in the active state of L level, odd number predecode signals XL<3,1> attain H level to drive odd number sub word lines (memory cells of odd number rows) into the selected state.

The circuit structure shown in FIGS. 20A–20C are provided for each address bit or each predecode signal bit.

In the normal operation mode, wafer burn-in mode instruction signal WBI is at L level, complementary wafer burn-in mode instruction signal /WBI is at H level, and NAND circuits 2*fb*, 2*fd*, 2*ib*, 2*ih* and 2*if* all operate as inverters so that this structure is equivalent to the structure of the level latch circuit shown in FIG. 9.

In the structures shown in FIGS. 20A–20C, the inverter of the level latch circuit is replaced with the NAND circuit for control of the address or predecode signal in the wafer burn-in test. The number of the gate stages is the same and the access time is never increased in the normal operation. In particular, in the level latch circuit shown in FIG. 9, the inverter circuit is usually constituted of an NOR circuit receiving the system reset signal, and the initial latch potential of the latch circuit is set at a predetermined voltage level when the system is reset or the power supply is started. If the NOR circuit for system reset is employed in the level latch circuit as an inverter for a latch circuit, the NOR circuit for system reset can be utilized for address control in the wafer burn-in mode. Therefore, no extra circuit structure nor gate is added and there is no adverse influence on the access in the normal operation mode.

FIG. 21 shows a list of relations between logic levels of wafer burn-in mode instruction signal WBI, and wafer burn-in control signals WBI_O and WBI_E and selected word lines (sub word lines) of word lines (sub word lines). In the wafer burn-in mode, bank activation signal RASE is driven to the active state of H level.

In the wafer burn-in mode, wafer burn-in mode instruction signal WBI is set in the active state of H level. In order to drive all word lines (sub word lines) into the selected state, wafer burn-in control signals WBI_O and WBI_E are set at H level. In order to drive odd number sub word lines into the selected state, wafer burn-in control signal WBI_O and wafer burn-in control signal WBI_E are set at H and L levels, respectively. In order to simultaneously drive even number sub word lines into the selected state, wafer burn-in control signals WBI_O and WBI_E are set at L and H levels, respectively.

In the normal operation mode, wafer burn-in mode instruction signal WBI and wafer burn-in control signals WBI_O and WBO_E are all set at L level.

In this wafer burn-in mode, three kinds of signals can be employed to determine selected word lines without application of address bits from an outside. Then, a wafer burn-in tester having a simple circuit structure can be utilized to execute the burn-in test easily at a wafer level. Wafer burn-in mode instruction signal WBI and wafer burn in control signals WBI_E and WBI_O are applied from the burn-in tester to an appropriate free pad (a pad which is not used in the normal operation mode) and supplied commonly to preprocessing circuits for all memory sub blocks.

Figure 22:
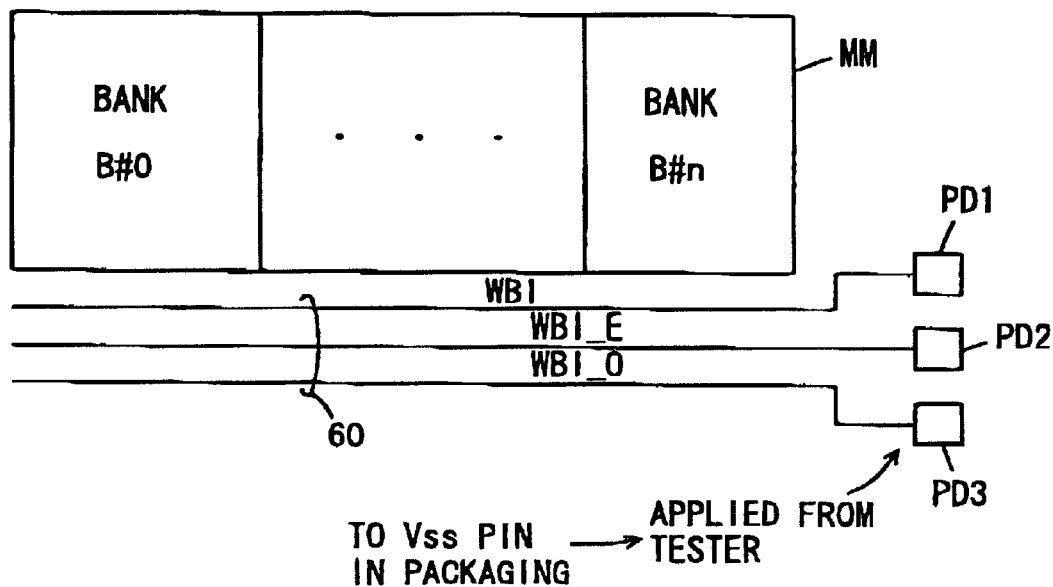
FIG. 22 shows an example of a structure of a portion generating a wafer burn-in mode instruction signal and a wafer burn-in control signal in the third embodiment.

FIG. 22 shows an example of a structure of a portion generating the wafer burn-in mode instruction signal and wafer burn-in control signals. Referring to FIG. 22, wafer burn-in mode instruction signal WBI is supplied from the burn in tester to a pad PD1, and wafer burn-in control signals WBI_E and WBI_O are applied from the burn-in tester to pads PD2 and PD3, respectively. Pads PD1–PD3 are coupled to a bus 60 extending in one direction along memory mat MM. A plurality of banks B#0–B#n are arranged in memory mat MM. When the burn-in test is performed at the wafer level, a desired voltage can be applied easily from the burn-in tester to pads PD1–PD3 so as to perform addressing in each of a plurality of banks B#0–B#n.

Signal bus 60 is commonly provided to banks B#0–B#n. Inverted signals /WBI, /WBI_E and /WBI_O are generated every bank or every memory sub block by inverter circuits. In packaging, these pads PD1–PD3 are coupled to a pin terminal supplying ground voltage Vss, and signals WBI, WBI_E and WBI_O on signal bus 60 are all fixed at L level. In this way, no complicated circuit structure is necessary and the burn-in mode instruction signal and burn-in mode control signals can be applied easily from the burn-in tester.

Figure 23:
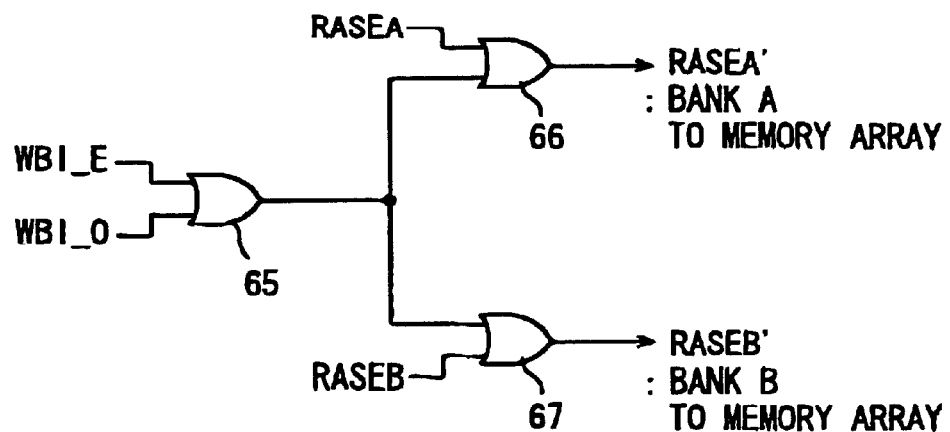
FIG. 23 is a schematic diagram showing a structure of a bank activation signal generating portion in the third embodiment.

FIG. 23 is a schematic diagram illustrating a structure of a portion generating a bank activation signal in the row-related control circuit. Referring to FIG. 23, an output portion of central row-related control circuit 1 includes an OR circuit 65 receiving wafer burn-in control signals WBI_O and WBI_E, an OR circuit 66 receiving bank activation signal RASEA and an output signal of OR circuit 65, and an OR circuit 67 receiving an output signal of OR circuit 65 and bank activation signal RASEB. Output signals of OR circuits 66 and 67 are provided to memory array portions of banks A and B as bank activation signals RASEA' and RASEB', respectively. In this way, in the wafer burn-in mode, bank activation signal RASEA for bank A and bank activation signal RASEB for bank B can be driven simultaneously into the active state according to burn-in control signals WBI_E and WBI_O supplied (from tester) to OR circuit 65 so as to perform a word line selecting operation.

According to the third embodiment of the invention, the gate circuits are employed instead of the inverters constituting the latch circuit in order to latch the row address bit and predecode signal as described above. In the wafer burn-in mode, the row address bits and predecode signals are set at a desired logic level so that word lines can be selected in various ways with a small number of control signals. In particular, it is unnecessary to externally supply a clock signal to take in an address signal, and burn-in test at a wafer level can be performed without operation of the clock signal.

The latch circuit and inverter circuit are utilized to change the manner in which the internal address bits or predecode signals are generated. Therefore, the number of gate stages does not increase and no adverse influence on the access time in the normal operation mode occurs.

Fourth Embodiment

Figure 24:
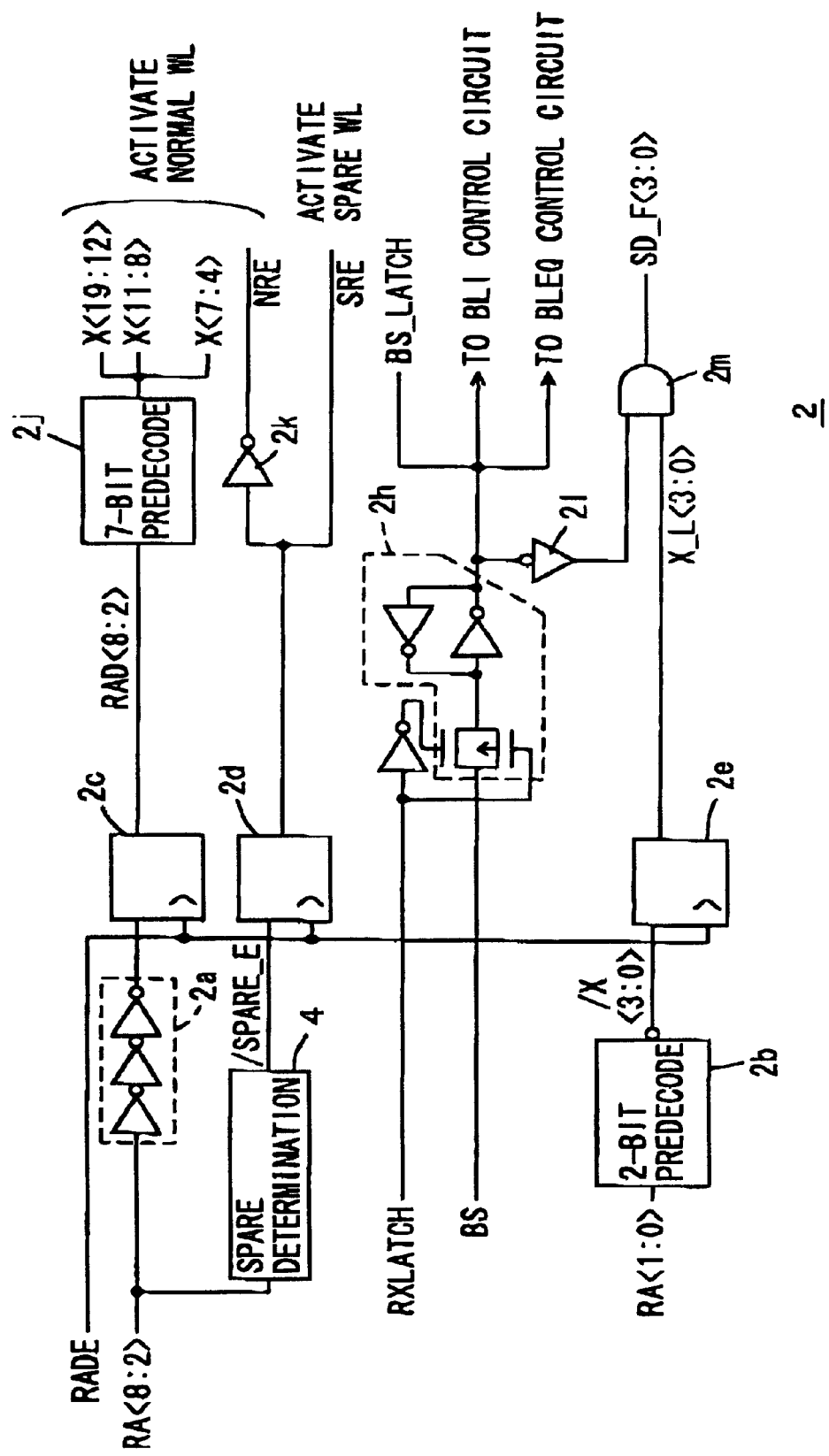
FIG. 24 is a schematic diagram showing a structure of a main portion of a semiconductor memory device in a fourth embodiment of the invention.
Figure 25:
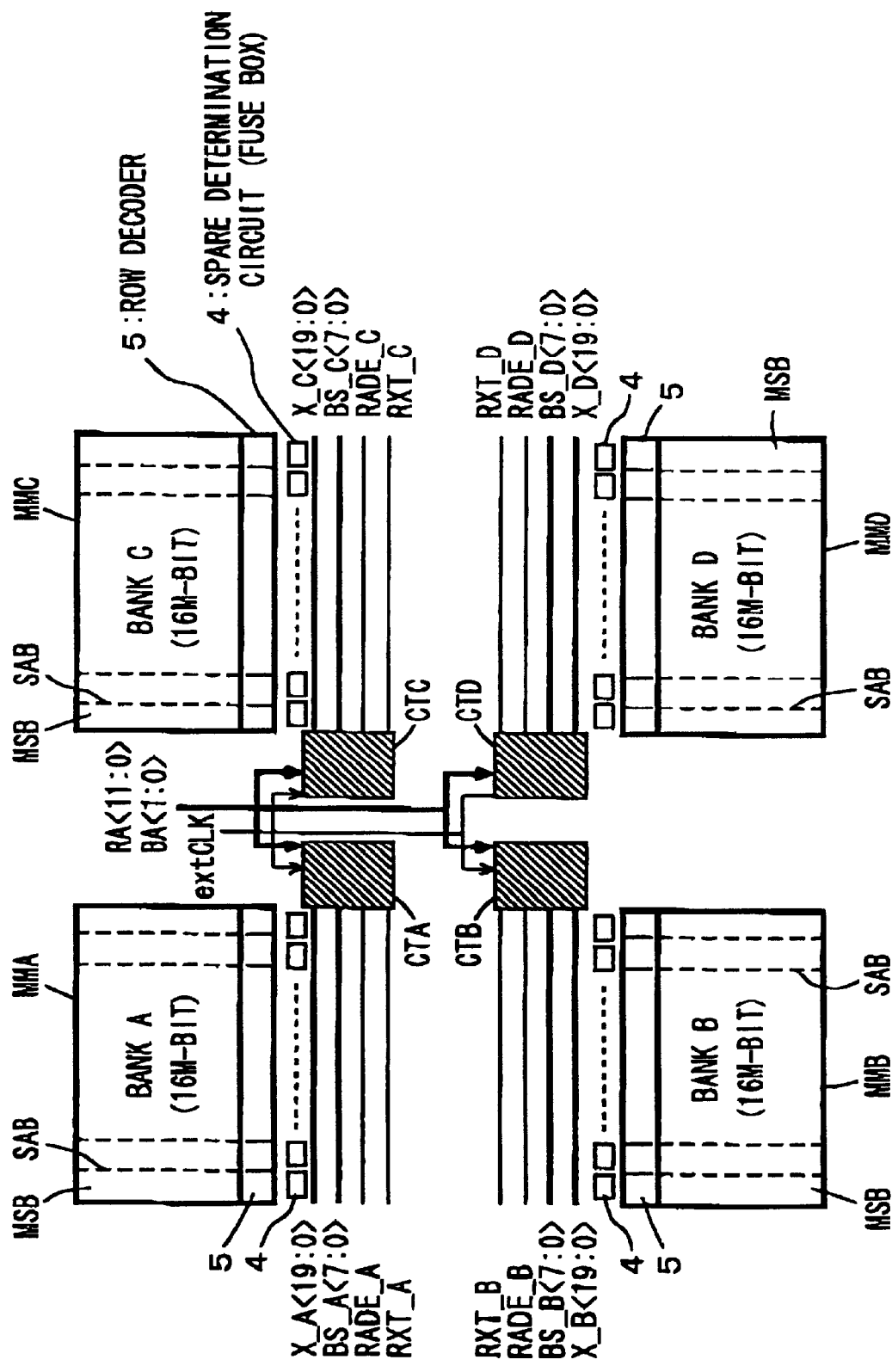
FIG. 25 is a schematic diagram showing an entire structure of a conventional semiconductor memory device.
Figure 27:
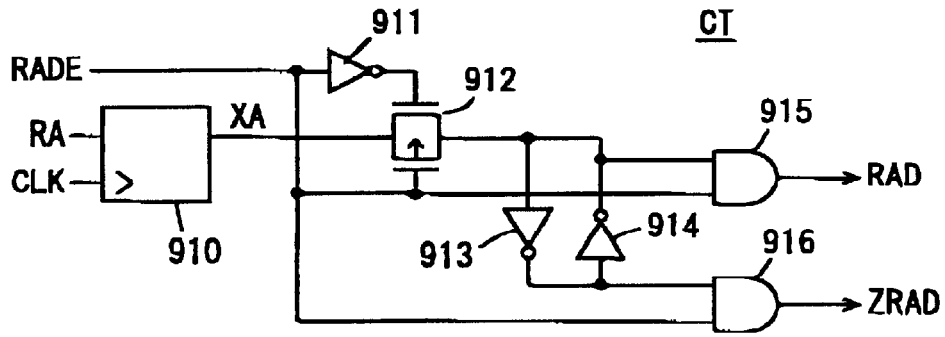
FIG. 27 is a schematic diagram showing a structure of a portion generating an internal row address in the conventional bank control circuit.
Figure 28:
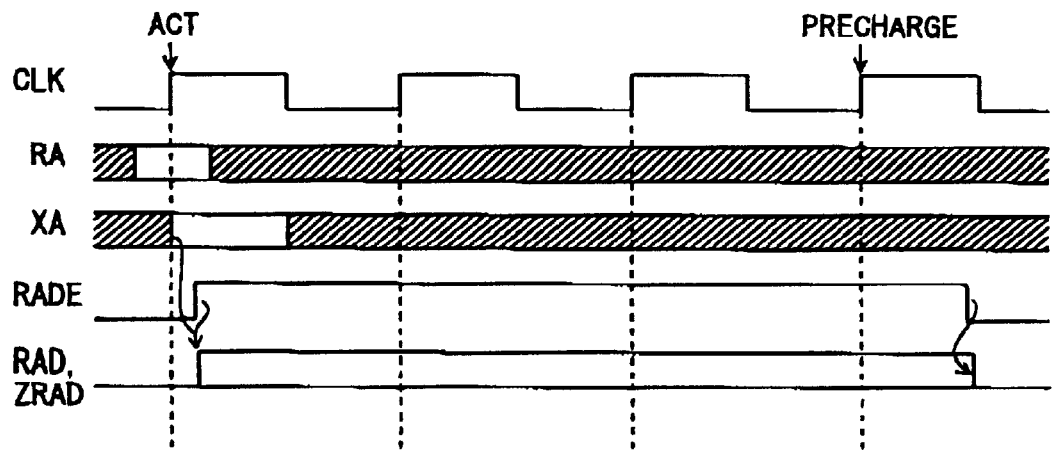
FIG. 28 is a timing chart illustrating an operation of the internal row address generating portion shown in FIG. 27.
Figure 29A:
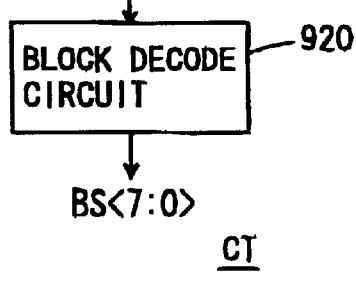
FIG. 29A is a schematic diagram showing a structure of a block selection signal generating portion of the conventional bank control circuit.
Figure 29B:
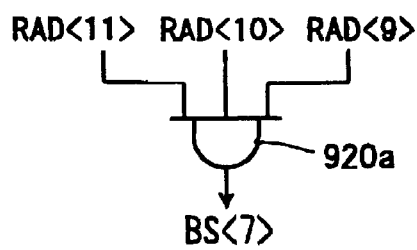
FIG. 29B shows an example of a structure of one block selection signal of a block decode circuit shown in FIG. 29A.
Figure 30:
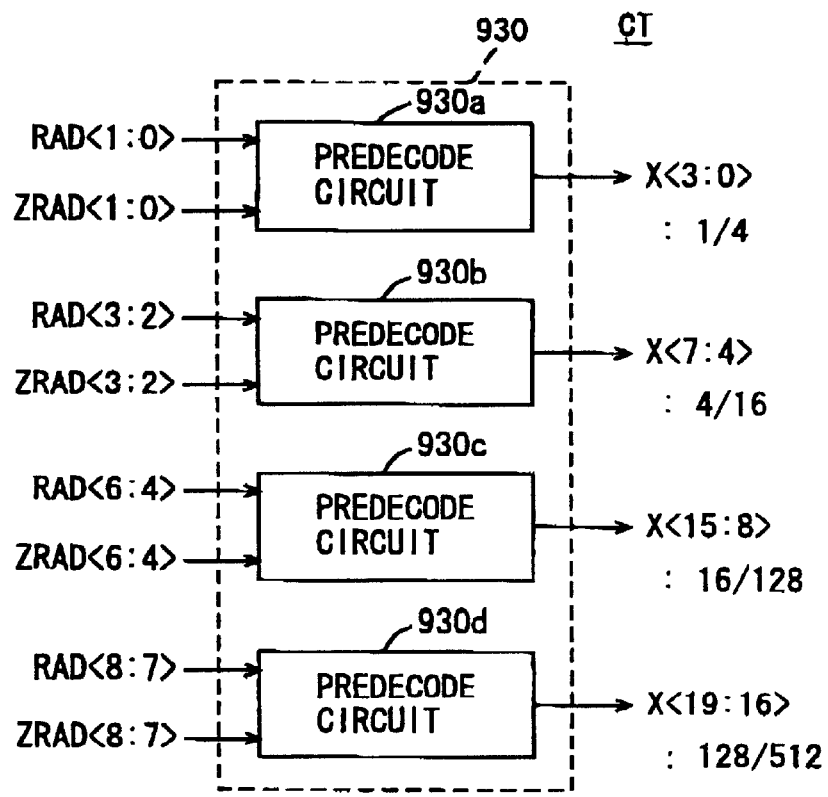
FIG. 30 is a schematic diagram showing a structure of a row predecode circuit in the conventional bank control circuit.
Figure 31:
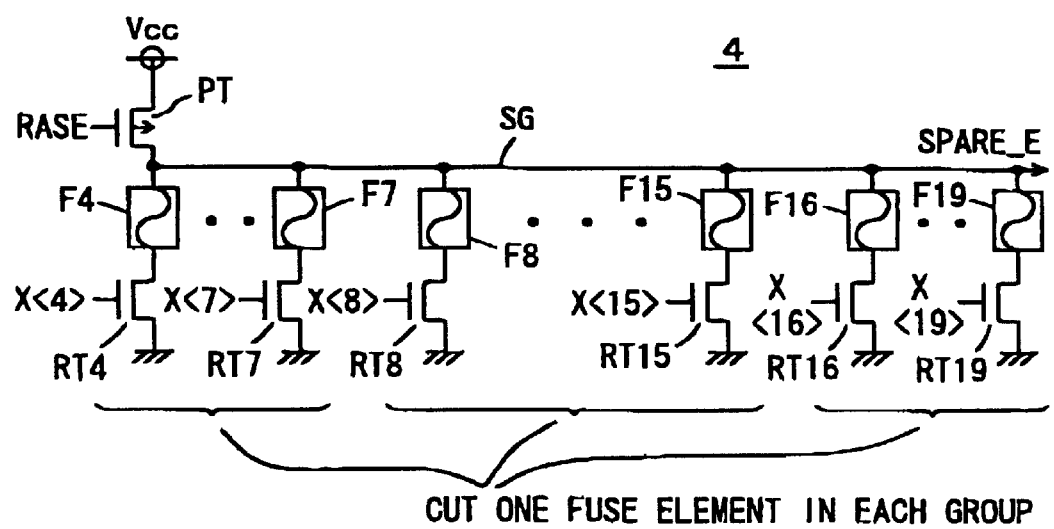
FIG. 31 shows a structure of a conventional spare determination circuit.

FIG. 24 is a schematic diagram showing a structure of a main portion of a semiconductor memory device according to the fourth embodiment of the invention. FIG. 24 illustrates a structure of a preprocessing circuit 2 provided for each memory sub block.

Referring to FIG. 24, in preprocessing circuit 2, up edge trigger type latch circuits 2c, 2d and 2e receive row address enable signal RADE instead of internal clock signal CLKR. No level latch circuit is placed in the following stage of up edge trigger type latch circuits 2c, 2d and 2e. For block selection signal BS, a level latch circuit 2h performing a latch operation according to latch instruction signal RXLATCH is provided, similarly to the structure shown in FIG. 9. Other components are similar to those shown in FIG. 9 and corresponding components have the same reference characters.

Internal clock signal CLKR is synchronized with external clock signal extCLK and attains H level at the fastest timing in response to the rising of the external clock signal. Therefore, an internal row selecting operation can be started faster if internal clock signal CLKR is used for driving the up edge trigger type latch circuit.

However, internal clock signal CLKR is independent of the bank address. The up edge trigger type latch circuit operates regardless of whether a bank is selected or not, and operates according to internal clock signal CLKR even in the standby state. Therefore, in an application requiring reduction of the power consumption, up edge trigger type latch circuits 2c, 2d and 2e are operated only in a selected bank and stopped from operating in a non-selected bank and in the standby state. Specifically, row address enable signal RADE is activated when active command ACT is supplied and bank activation signal RASE is activated. Only when the row access is made in a selected bank, up edge trigger type latch circuits 2c–2e operate so as to reduce the power consumption in the standby state. Block selection signal BS is maintained in the active state for one clock cycle period when activated. Similarly to the structure shown in FIG. 9, block selection signal BS is latched according to latch instruction signal RXLATCH and level latch circuit 2h surely performs its latching operation when block selection signal BS attains the definite state so as to avoid the influence of the propagation delay time that occurs when block selection signal BS is transmitted synchronously with the internal clock signal.

Bank activation signal RASE is also used for generating a row-related circuit operation control signal in central row-related control circuit 1 on a bank basis. Therefore, bank activation signal RASE may be supplied as a trigger signal (clock signal) of up edge trigger type latch circuits 2c–2e for preprocessing circuit 2 of each memory block of a corresponding bank.

According to the fourth embodiment of the invention, in the preprocessing circuit arranged corresponding to each memory sub block, the row-related operation control signal driven into the active state upon activation of the bank is supplied instead of clock signal CLKR. Consequently, the up edge trigger type latch circuit can be operated only when a selected bank is driven and thus the power consumption, especially the power consumption in the standby cycle can be reduced remarkably.

Other Applications

The description above relates to the clock synchronous type DRAM to which a command is externally supplied. However, the present invention achieves similar effects in a clock synchronous type semiconductor memory device to which a row address strove signal /RAS, a column address strobe signal /CAS, a write enable signal /WE and a chip enable signal /CS are externally supplied synchronously with a clock signal, and an operation mode therein is designated by a combination of logic states of these control signals at the rising edge of the clock signal. This is because the set up time of the row address signal is secured similarly for the clock signal. In a standard clock synchronous semiconductor memory device (utilizing a combination of the states of a plurality of control signals as a command), when active command ACT is applied, the array activation instruction signal is activated in response to the rising of internal clock signal CLKR so as to start an internal row selecting operation. Therefore, instead of the up edge trigger type latch circuit for generating bank activation signal RASE, a set/reset flip-flop (set when the active command is applied and reset when the precharge command is applied) can be employed. The structure of the other components discussed above can be employed for the flip-flop.

Although the structure of two memory mats is presented, the present invention is applicable to a structure in which four memory mats are arranged, a central row-related control circuit is arranged in the central portion of the four memory mats, and each memory mat is divided into a plurality of banks. The memory device may have any storage capacity.

As heretofore described, according to the present invention, a semiconductor memory device can be implemented which operates at a high speed and is easily adaptable to bank expansion without increase in the chip occupation area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
 a memory array divided into a plurality of banks each having a plurality of memory cells, said plurality of banks driven into active state independently of each other;
 central control circuitry arranged on one side of said memory array, receiving externally supplied external clock signal and external address signal, generating an internal clock signal and an internal address signal asynchronous with said internal clock signal and transmitting, in one direction, said internal clock signal and said internal address signal of multiple bits commonly to said plurality of banks of said memory array;

a preprocessing circuit provided corresponding to each of said plurality of banks of said memory array, latching predetermined bits of said internal address signal synchronously with a latch timing signal received from said central control circuitry and predecoding the latched internal address signal bits to generate a predecode signal; and a selection circuit provided corresponding to each of said plurality of banks of said memory array for selecting an addressed memory cell of a corresponding bank according to the predecode signal from a corresponding preprocessing circuit.

2. The semiconductor memory device according to claim 1, wherein said central control circuitry includes a control signal generation circuit for generating a control signal synchronously with said external clock signal to activate a memory cell selecting operation for a designated bank among said plurality of banks according to an externally supplied bank activation instruction signal, and said preprocessing circuit is each activated according to said control signal.

3. The semiconductor memory device according to claim 1, wherein each of said plurality of banks of said memory array includes a plurality of memory sub blocks each having a plurality of the memory cells, said central control circuitry includes a circuit receiving a block address signal specifying a predetermined number of memory sub blocks among said plurality of memory sub blocks in parallel with said external address signal, latching the received block address signal for one cycle period of said external clock signal and transmitting the latched block address signal commonly to said plurality of banks.

4. The semiconductor memory device according to claim 1, further comprising:

a spare determination circuit storing a defective bit address indicating a position of a defective bit and receiving said internal address signal to generate a signal for activating a spare circuit used for repairing the defective bit when the received internal address signal indicates said defective bit address, wherein said preprocessing circuit includes a latch circuit latching an output signal of said spare determination circuit synchronously with said latch timing signal to generate a spare enable signal enabling said spare circuit.

5. The semiconductor memory device according to claim 2, wherein said preprocessing circuit includes:

a latch circuit receiving said internal clock signal as said latch timing signal, for latching said internal address signal synchronously with said internal clock signal;

a level latch circuit for latching an output signal of said latch circuit according to a latch enable signal included in said control signal; and a predecode circuit for predecoding an output signal of said level latch circuit.

6. The semiconductor memory device according to claim 4, wherein said central control circuitry includes a control signal generation circuit for generating a control signal for activating a memory cell selecting operation for a bank designated according to a bank activation instruction signal, and said preprocessing circuit further includes a normal/spare activation circuit latching a spare determination signal according to a latch enable signal included in said control signal to activate one of said spare circuit and a normal cell selection circuit.

7. The semiconductor memory device according to claim 4, wherein said plurality of banks of said memory array each include a plurality of memory sub blocks, and said spare determination circuit is provided corresponding to each of said memory sub blocks.

8. The semiconductor memory device according to claim 1, wherein said memory array includes the memory cells arranged in rows and columns and hierarchical word lines arranged corresponding to the rows of the memory cells, said hierarchical word lines have main word lines and sub word lines connected to the memory cells, and a main word line is provided for a predetermined number of sub word lines, and said preprocessing circuit includes:

a predecode circuit for predecoding, asynchronously with said latch timing signal, a sub word line address bit specifying one of said predetermined number of sub word lines included in said internal address signal to generate a sub word line predecode signal;

a latch circuit latching an output signal of said predecode circuit synchronously with said latch timing signal; and a circuit generating a sub decode signal for specifying a sub word line according to an output signal of said latch circuit.

9. The semiconductor memory device according to claim 1, wherein said plurality of memory cells of said memory array require refreshing of stored data, and said central control circuitry includes:

a refresh timer circuit responsive to a self refresh mode instruction signal for generating a refresh request at a predetermined interval; and a clock generation circuit for generating said internal clock signal according to said refresh request and said external clock signal.

10. The semiconductor memory device according to claim 9, wherein said central control circuitry further includes:

a refresh address counter for generating a refresh address when said self refresh mode instruction signal is activated; and a block latch circuit for latching a predetermined number of refresh bits of said refresh address counter synchronously with said internal clock signal to generate and apply a block selection signal commonly to said plurality of banks, and each of said plurality of banks of said memory array includes a plurality of sub blocks each having a plurality of the memory cells, and said block selection signal specifies a predetermined number of sub blocks among said plurality of sub blocks.

11. The semiconductor memory device according to claim 1, wherein said preprocessing circuit includes predecode means responsive to a stress acceleration mode instruction signal for setting particular bits of said internal address signal into a selected state of a predetermined logic level to decode said internal address signal.

12. The semiconductor memory device according to claim 2, wherein
said preprocessing circuit includes:
a first latch circuit for latching an address signal corresponding to said internal address signal according to an address latch timing signal included in said control signal; and
an address output circuit responsive to activation of a stress acceleration mode instruction signal for setting an output signal of said first latch circuit at a predetermined logic level representing a selected state, and latching the output signal of said first latch circuit, when said stress acceleration mode instruction signal is inactivated, to generate the address signal corresponding to said internal address signal.

13. The semiconductor memory device according to claim 8, wherein
said latch circuit includes a gate latch circuit for setting said sub decode signal selectively into a selected state according to a stress acceleration mode instruction signal, and latching and outputting the output signal of said predecode circuit when said stress acceleration mode instruction signal is inactivated.

14. The semiconductor memory device according to claim 1, wherein
said latch timing signal is activated in response to a bank activation instruction signal and maintained in an active state during a period in which a bank designated by said bank activation instruction signal is in the active state.

15. The semiconductor memory device according to claim 1, wherein
said latch timing signal is said internal clock signal generated synchronously with said external clock signal.

16. The semiconductor memory device according to claim 1, wherein
each of said plurality of banks of said memory array includes a plurality of sub blocks each having a plurality of the memory cells,
said central control circuitry includes a circuit for generating at least first and second latch enable signals for activating a bank designated by a received bank activation instruction signal, and a circuit for generating, synchronously with said internal clock signal, a block selection signal designating a predetermined number of sub blocks among said plurality of sub blocks according to a block address signal supplied in parallel with said bank activation instruction signal, and
said preprocessing circuit includes:
a first latch circuit receiving the first latch enable signal as said latch timing signal to latch said internal address signal in response to said first latch enable signal; and
a second latch circuit for latching said block selection signal synchronously with the second latch enable signal.

17. The semiconductor memory device according to claim 16, further comprising:
a spare determination circuit storing a defective bit address representing a position of a defective bit of said memory array and receiving said internal address signal, for generating a spare determination signal indicating whether the received internal address signal designates said defective bit address;
a spare latch circuit for latching an output signal of said spare determination circuit in response to said first latch enable signal; and
a spare enable circuit generating a spare enable signal for activating a spare circuit for repairing said defective bit according to an output signal of said spare latch circuit.

18. A semiconductor memory device comprising:
a memory array divided into a plurality of banks each divided into a plurality of sub blocks each having a plurality of memory cells, said plurality of banks driven into an active state independently of each other, and said plurality of banks each including a predetermined number of sub blocks;
a control signal generation circuit for supplying a control signal to each of said banks to drive a designated bank into the active state according to a bank activation instruction signal;
a block selection signal generation circuit provided common to said plurality of banks, for latching, synchronously with an externally supplied clock signal, a block selection signal supplied in parallel with said bank activation instruction signal and supplying the latched block selection signal commonly to said plurality of banks;
an address generation circuit for supplying an externally supplied address signal commonly to said plurality of banks asynchronously with said clock signal;
a spare determination circuit provided corresponding to at least each of said plurality of banks, for determining, according to the address signal from said address generation circuit and a pre-programmed defective bit address, whether said address signal designates the defective bit address to output a spare determination result signal indicating a result of determination; and
a preprocessing circuit provided corresponding to each of said plurality of banks, for latching the address signal from said address generation circuit according to a latch timing signal, and predecoding the latched address signal for latching when an operation control signal included in said control signal is activated, said operation control signal being in an active state during a period in which a corresponding bank is designated by said bank activation instruction signal and is maintained in the active state, said preprocessing circuit including
a spare latch circuit for latching an output signal of said spare determination circuit according to said latch timing signal, and
a spare enable circuit for generating a spare enable signal to activate a spare circuit for repairing a defective bit according to an output signal of said spare latch circuit.

19. The semiconductor memory device according to claim 18, wherein
said spare enable circuit includes a circuit for latching an output signal of said spare latch circuit according to activation of said operation control signal, and
said latch timing signal is an internal clock signal generated in response to said externally supplied clock signal.

20. The semiconductor memory device according to claim 18, wherein
said latch timing signal is said operation control signal.

21. A semiconductor memory device comprising:
a memory array including a plurality of sub block each including a plurality of memory cells arranged in rows and columns, and a plurality of word lines arranged corresponding to the rows of memory cells;
block selection signal generation circuitry provided commonly to the plurality of sub blocks, for latching a block selection signal for selecting a sub block out of the plurality of sub blocks in synchronization with an externally applied external clock signal;

address generation circuitry provided commonly to the plurality of sub blocks, for applying an externally applied row address signal commonly to the plurality of sub blocks asynchronously to the external clock signal;

spare determination circuit provided for each of the sub blocks, for storing a defective address indicating a location of a defective memory cell of a corresponding sub block, determining whether the row address signal received from said address generation circuitry designates an address of the defective memory cell, and generating a spare determination signal indicating a result of determination;

preprocessing circuit provided corresponding to each of the sub blocks, and including an address latching circuit for latching the spare determination signal received from a corresponding spare determination circuit and the row address signal from the address generation circuitry in accordance with a latch timing signal; and row selection circuitry provided corresponding to each of the sub blocks, for selecting a word line out of the plurality of word lines of a corresponding sub block in accordance with a result of processing of a corresponding preprocessing circuit.

22. The semiconductor memory device according to claim 21, wherein said preprocessing circuit includes a predecoder for predecoding a received address signal from said address latching circuit.

23. The semiconductor memory device according to claim 21, wherein said address latching circuit includes a latch circuit and a spare latch circuit each receiving an internal clock signal corresponding to the external clock signal as said latch timing signal, and said latch circuit and said spare latch circuit latches the address signal received from said address generation circuitry and the spare determination signal received from said spare determination circuit, respectively in synchronization with said internal clock signal.

24. The semiconductor memory device according to claim 23, wherein said address latching circuit further includes:

a level latch circuit for latching an output signal of said latch circuit in accordance with a latch enable signal generated internally in response to an externally applied control signal; and a normal/spare activation circuit for latching an output signal of said spare latch circuit in accordance with said latch enable signal.

25. The semiconductor memory device according to claim 21, wherein said preprocessing circuit includes a predecode circuit for predecoding the row address signal received from said address generation circuitry.

26. The semiconductor memory device according to claim 21, further comprising control signal generation circuitry provided commonly to the plurality of sub blocks, for activating a memory cell selection operation in accordance with an externally applied memory activating signal.

27. The semiconductor memory device according to claim 25, wherein said row selection circuitry a normal cell, either one of the normal cell selection circuit and said spare circuit in accordance with an output signal of said control signal generation circuitry and an output signal of said preprocessing circuit.

28. The semiconductor device according to claim 21, wherein the memory cells include normal cell for storing data and spare memory cells for repairing a defective normal memory cell, and the word lines include a normal word line provided for a row of normal memory cells and a spare word line provided for a row of spare memory cells.

29. The semiconductor memory device according to claim 28, wherein the word lines arranged in a hierarchical word line arrangement in which a main word line is provided for a predetermined number of rows of memory cells and a sub word line provided for each of rows of memory cells and connected to memory cells on a corresponding row.

* * * * *